United States Patent
Weeks et al.

(10) Patent No.: US 7,233,028 B2
(45) Date of Patent: Jun. 19, 2007

(54) GALLIUM NITRIDE MATERIAL DEVICES AND METHODS OF FORMING THE SAME

(75) Inventors: T. Warren Weeks, Raleigh, NC (US); Kevin J. Linthicum, Cary, NC (US)

(73) Assignee: Nitronex Corporation, Raleigh, NC (US)

( * ) Notice: Subject to any disclaimer, the term of this patent is extended or adjusted under 35 U.S.C. 154(b) by 0 days.

(21) Appl. No.: 10/650,122

(22) Filed: Aug. 25, 2003

(65) Prior Publication Data

US 2004/0130002 A1 Jul. 8, 2004

Related U.S. Application Data

(63) Continuation-in-part of application No. 09/792,414, filed on Feb. 23, 2001, now Pat. No. 6,611,002.

(51) Int. Cl.
*H01L 29/06* (2006.01)

(52) U.S. Cl. .............................. 257/98; 257/94; 257/95; 257/622; 257/623; 257/E33.005

(58) Field of Classification Search .................. 257/94, 257/95, 622, 623, 98, E33.005; 438/22, 438/29, 978

See application file for complete search history.

(56) References Cited

U.S. PATENT DOCUMENTS

| | | | | |
|---|---|---|---|---|
| 3,696,262 | A | * | 10/1972 | Antypas ...................... 313/530 |
| 4,038,580 | A | * | 7/1977 | Porret ......................... 313/498 |
| 4,053,914 | A | * | 10/1977 | Goodwin ..................... 257/95 |
| 4,537,654 | A | * | 8/1985 | Berenz et al. .............. 438/176 |
| 4,582,952 | A | * | 4/1986 | McNeely et al. ........... 136/249 |
| 4,706,101 | A | * | 11/1987 | Nakamura et al. ............ 257/97 |
| 4,821,093 | A | * | 4/1989 | Iafrate et al. ............... 257/194 |
| 5,037,782 | A | * | 8/1991 | Nakamura et al. .......... 438/167 |
| 5,192,987 | A | * | 3/1993 | Khan et al. .............. 257/183.1 |
| 5,252,842 | A | * | 10/1993 | Buck et al. ................. 257/280 |
| 5,296,395 | A | | 3/1994 | Khan et al. |
| 5,389,571 | A | | 2/1995 | Takeuchi et al. |
| 5,393,993 | A | | 2/1995 | Edmond et al. |
| 5,438,212 | A | | 8/1995 | Okaniwa |
| 5,523,589 | A | | 6/1996 | Edmond et al. |

(Continued)

FOREIGN PATENT DOCUMENTS

DE 199 31 300 A1 2/2000

(Continued)

OTHER PUBLICATIONS

DenBaars, S.P., et al., "What's Next (2)," presentation made at "Blue 2003: Behind the Hot Apps" conference held in Dallas, TX on Jun. 13, 2003.

(Continued)

*Primary Examiner*—Eugene Lee
(74) *Attorney, Agent, or Firm*—Wolf, Greenfield & Sacks, P.C.

(57) ABSTRACT

The invention provides gallium nitride material devices, structures and methods of forming the same. The devices include a gallium nitride material formed over a substrate, such as silicon. Exemplary devices include light emitting devices (e.g., LED's, lasers), light detecting devices (such as detectors and sensors), power rectifier diodes and FETs (e.g., HFETs), amongst others.

47 Claims, 28 Drawing Sheets

U.S. PATENT DOCUMENTS

| | | | |
|---|---|---|---|
| 5,739,554 A | 4/1998 | Edmond et al. | |
| 5,760,426 A | 6/1998 | Marx et al. | |
| 5,834,325 A * | 11/1998 | Motoki et al. | 438/22 |
| 5,838,706 A | 11/1998 | Edmond et al. | |
| 5,862,167 A * | 1/1999 | Sassa et al. | 372/45 |
| 5,864,171 A | 1/1999 | Yamamoto et al. | |
| 5,874,747 A | 2/1999 | Redwing et al. | |
| 5,905,275 A * | 5/1999 | Nunoue et al. | 257/95 |
| 5,928,421 A | 7/1999 | Yuri et al. | |
| 6,045,626 A | 4/2000 | Yano et al. | |
| 6,051,849 A | 4/2000 | Davis et al. | |
| 6,069,394 A * | 5/2000 | Hashimoto et al. | 257/466 |
| 6,120,600 A * | 9/2000 | Edmond et al. | 117/89 |
| 6,121,121 A | 9/2000 | Koide | |
| 6,153,010 A | 11/2000 | Kiyoku et al. | |
| 6,156,581 A * | 12/2000 | Vaudo et al. | 438/22 |
| 6,177,688 B1 | 1/2001 | Linthicum et al. | |
| 6,201,262 B1 | 3/2001 | Edmond et al. | |
| 6,201,265 B1 * | 3/2001 | Teraguchi | 257/99 |
| 6,225,648 B1 * | 5/2001 | Hsieh et al. | 257/95 |
| 6,232,623 B1 * | 5/2001 | Morita | 257/103 |
| 6,255,198 B1 | 7/2001 | Linthicum et al. | |
| 6,261,929 B1 | 7/2001 | Gehrke et al. | |
| 6,265,289 B1 | 7/2001 | Zheleva et al. | |
| 6,355,497 B1 | 3/2002 | Romano et al. | |
| 6,429,460 B1 * | 8/2002 | Chen et al. | 257/79 |
| 6,465,809 B1 * | 10/2002 | Furukawa et al. | 257/94 |
| 6,515,303 B2 * | 2/2003 | Ring | 257/77 |
| 6,521,917 B1 * | 2/2003 | Takayama et al. | 257/103 |
| 6,611,002 B2 | 8/2003 | Weeks et al. | |
| 6,617,060 B2 | 9/2003 | Weeks et al. | |
| 6,649,287 B2 | 11/2003 | Weeks et al. | |
| 6,657,237 B2 * | 12/2003 | Kwak et al. | 257/99 |
| 6,707,074 B2 | 3/2004 | Yoshii et al. | |
| 2001/0040245 A1 | 11/2001 | Kawai | |
| 2002/0074552 A1 | 6/2002 | Weeks et al. | |
| 2002/0117681 A1 | 8/2002 | Weeks et al. | |
| 2003/0116791 A1 | 6/2003 | Baptist et al. | |

FOREIGN PATENT DOCUMENTS

| | | |
|---|---|---|
| EP | 0 740 376 A1 | 10/1996 |
| EP | 0 852 416 A1 | 7/1998 |
| EP | 0 951 055 A2 | 10/1999 |
| FR | 2 809 534 A | 11/2001 |
| JP | 09326534 A | 12/1997 |
| JP | 10242584 | 9/1998 |
| JP | 10242584 A | 9/1998 |
| JP | 11317546 A * | 11/1999 |
| WO | WO 00/33365 A1 | 6/2000 |
| WO | WO 01/37327 A1 | 5/2001 |
| WO | WO 01/43174 A2 | 6/2001 |
| WO | WO 01/47002 A2 | 6/2001 |
| WO | WO 01/59819 A1 | 8/2001 |
| WO | WO 02/069410 A2 | 9/2002 |

OTHER PUBLICATIONS

International Search Report dated Aug. 25, 2004, PCT Application No. US2004/027657.

* cited by examiner

GALLIUM NITRIDE MATERIAL DEVICES AND METHODS OF FORMING THE SAME

RELATED APPLICATIONS

This application is a continuation-in part of U.S. patent application Ser. No. 09/792,414, filed Feb. 23, 2001, which issued as U.S. Pat. No. 6,611,002, and entitled "Gallium Nitride Material Devices and Methods Including Backside Vias," the disclosure of which is incorporated herein by reference.

FIELD OF INVENTION

The invention relates generally to semiconductor materials and, more particularly, to gallium nitride materials and methods of producing gallium nitride materials.

BACKGROUND OF INVENTION

Gallium nitride materials include gallium nitride (GaN) and its alloys such as aluminum gallium nitride (AlGaN), indium gallium nitride (InGaN), and aluminum indium gallium nitride (AlInGaN). These materials are semiconductor compounds that have a relatively wide, direct bandgap which permits highly energetic electronic transitions to occur. Such electronic transitions can result in gallium nitride materials having a number of attractive properties including the ability to efficiently emit visible (e.g., blue, green) or UV light, the ability to transmit signals at high frequency, and others. Accordingly, gallium nitride materials are being widely investigated in many semiconductor device applications such as transistors, field emitters, and optoelectronic devices.

Gallium nitride materials have been formed on a number of different substrates including silicon carbide (SiC), sapphire, and silicon. Silicon substrates are readily available and relatively inexpensive, and silicon processing technology has been well developed. However, forming gallium nitride materials on silicon substrates to produce semiconductor devices presents challenges which arise from differences in the lattice constant, thermal expansion, and band gap between silicon and gallium nitride.

SUMMARY OF INVENTION

The invention includes providing gallium nitride material structures, devices and methods of forming the structures and devices.

In one aspect, a semiconductor device is provided. The device comprises a substrate, and a gallium nitride material region formed over the substrate. The semiconductor device has at least one via extending from a first side of the semiconductor device, wherein the via is free of an electrical contact formed therein.

In another aspect, a method of forming a semiconductor device is provided. The method comprises forming a gallium nitride material region over a substrate, and forming a via extending from a first side of the semiconductor device. The via is free of an electrical contact formed therein.

In another aspect, a semiconductor device is provided. The semiconductor device comprises a silicon substrate and a gallium nitride material region formed over the silicon substrate. The device further comprises a first electrical contact formed over a portion of the gallium nitride material region, and a second electrical contact formed over a portion of the gallium nitride material region. The semiconductor device has at least one via extending from a backside of the semiconductor device.

In another aspect, a method of forming a semiconductor device is provided. The method comprises forming a gallium nitride material region over a silicon substrate, forming a first electrical contact over the gallium nitride material region, and forming a second electrical contact over the gallium nitride material region. The method further comprises forming a via extending from a backside of the semiconductor device.

In another aspect, an opto-electronic device is provided. The opto-electronic device comprises a silicon substrate, a compositionally-graded transition layer formed over the silicon substrate, and a gallium nitride material region formed over the compositionally-graded transition layer. The gallium nitride material region includes an active region.

In another aspect, a method of forming a opto-electronic device is provided. The method comprises forming a compositionally-graded transition layer formed over a silicon substrate, and forming a gallium nitride material region over the compositionally-graded transition layer. The gallium nitride material region includes an active region.

In another aspect, a method of forming a semiconductor structure is provided. The method comprises forming a first transition layer over a silicon substrate, forming a gallium nitride material region over the first transition layer, and removing the silicon substrate to expose a backside of the transition layer.

In another aspect, an opto-electronic device is provided. The opto-electronic device comprises a transition layer comprising a gallium nitride alloy, aluminum nitride, or an aluminum nitride alloy. The transition layer has an exposed back surface. The device further comprises a gallium nitride material region formed over a front surface of the transition layer. The gallium nitride material region includes an active region.

In another aspect, an opto-electronic device is provided. The opto-electronic device comprises a transition layer comprising a gallium nitride alloy, aluminum nitride, or an aluminum nitride alloy. The device further comprises an electrical contact formed directly on a back surface of the transition layer, and a gallium nitride material region formed over a front surface of the transition layer. The gallium nitride material region includes an active region.

In another aspect, an opto-electronic device is provided. The opto-electronic device comprises a silicon substrate, a gallium nitride material region formed over the substrate. The gallium nitride material region includes an active region, wherein the active region has a non-rectangular plane-view cross-section.

In another aspect, an opto-electronic device is provided. The opto-electronic device comprises a substrate, a gallium nitride material region formed over the substrate. The gallium nitride material region includes an active region, wherein the active region has a non-rectangular plane-view cross-section. A non-active region of the opto-electronic device has a non-rectangular plane-view cross-section.

In another aspect, a method is provided. The method comprises forming an active region having a non-rectangular plane-view cross-section. The active region is a portion of a gallium nitride material region formed on a silicon substrate.

In another aspect, a method is provided. The method comprises forming an active region having a non-rectangular plane-view cross-section. The active region is a portion of a gallium nitride material region formed on a substrate. The method further comprises forming a non-active region having a non-rectangular plane-view cross-section.

Other aspects, embodiments and features of the invention will become apparent from the following detailed description of the invention when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION OF THE INVENTION

The invention provides gallium nitride material structures, devices and methods of forming the structures and devices.

Figure 1:
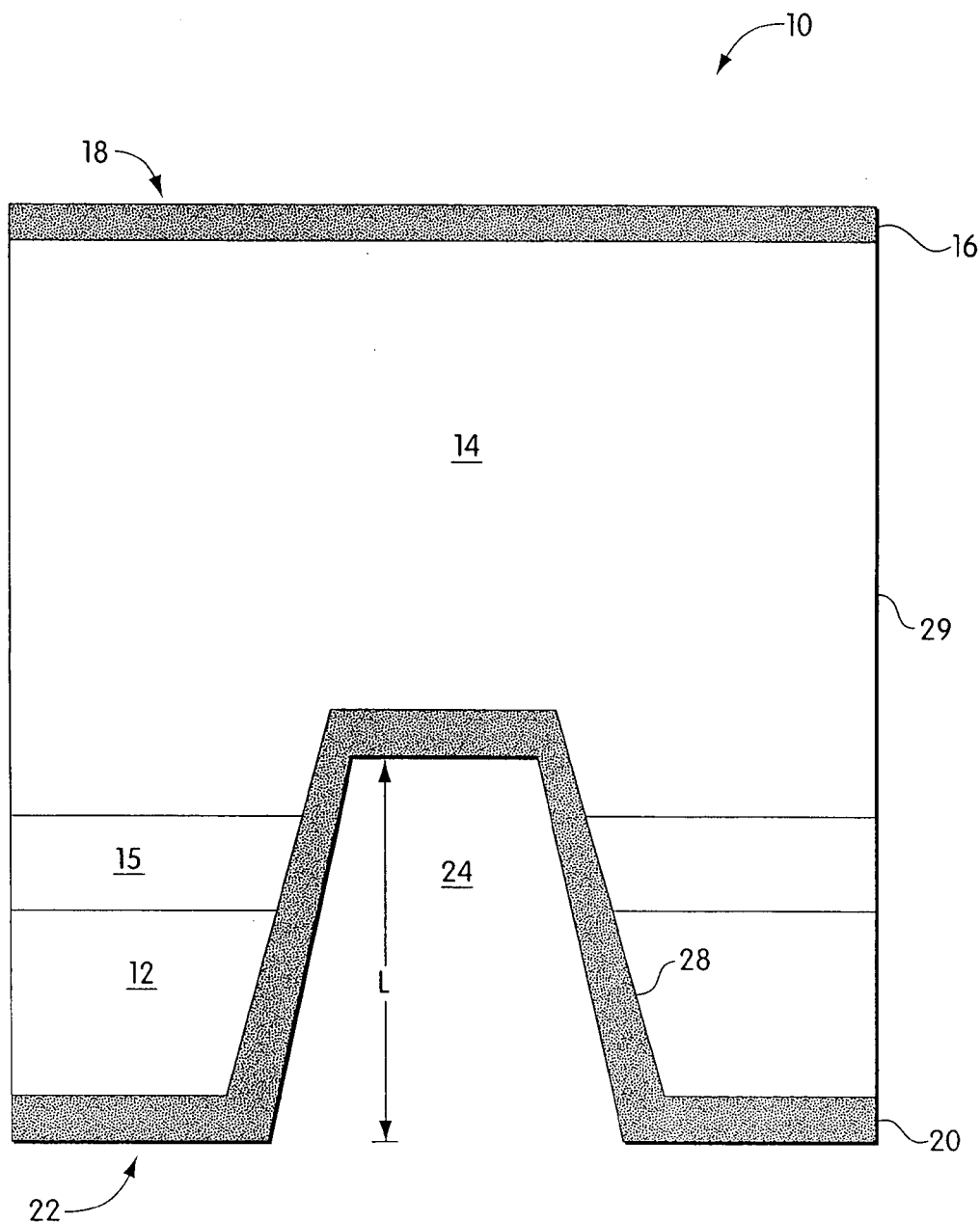
FIG. 1 illustrates a semiconductor device including a backside via according to one embodiment of the present invention.

Referring to FIG. 1, a semiconductor device 10 according to one embodiment of the invention is shown. Semiconductor device 10 includes a substrate 12 and a gallium nitride material device region 14 formed over the substrate. As described further below, device structures are typically formed, at least in part, within gallium nitride material region 14. Device 10 further includes a transition layer 15 formed on substrate 12, for example, to facilitate the subsequent deposition of gallium nitride material device region 14. In some cases, the transition layer (or, at least a portion of the transition layer) may be non-conducting. A topside electrical contact 16 (on a topside 18 of the device) and a backside electrical contact 20 (on a backside 22 of the device) are provided for connection to an external power supply that powers the device. Backside contact 20 is deposited within a via 24 that extends from backside 22 of the device. Via 24 extends through transition layer 15 and into a conducting region (e.g., device region 14) within device 10. As a result of the deposition of backside contact 20 within via 24, current can flow between the backside contact and topside contact 16 through device region 14 without being blocked by transition layer 15, when the transition layer is non-conducting. Thus, vertical conduction through device 10 between backside contact 20 and topside contact 16 may be achieved despite the presence of a non-conducting transition layer 15.

Figure 22:
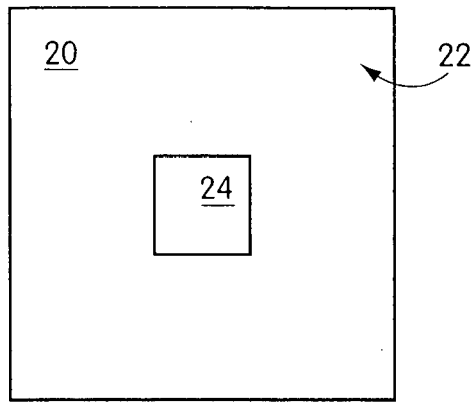
FIG. 22 illustrates a view of a backside the device of FIG. 1.

FIG. 22 illustrates a view of backside 22 of device 10.

As used herein, "non-conducting" refers to a layer that prevents current flow or limits current flow to negligible amounts in one or more directions. "Non-conducting" layers, for example, may be formed of non-conductor materials, or may be formed of semiconductor materials which have a band sufficiently offset from the layer adjacent the "non-conducting" layer. A "non-conducting" layer may be conductive in and of itself, but may still be non-conducting (e.g., in a vertical direction) as a result of a band offset or discontinuity with an adjacent layer. As used herein, "vertical conduction" refers to electrical current flow in a vertical direction within a device. "Vertical conduction" may be between backside contact and topside contact or may be between different layers within the device that are separated vertically.

It should be understood that when a layer is referred to as being "on" or "over" another layer or substrate, it can be directly on the layer or substrate, or an intervening layer also may be present. A layer that is "directly on" another layer or substrate means that no intervening layer is present. It should also be understood that when a layer is referred to as being "on" or "over" another layer or substrate, it may cover the entire layer or substrate, or a portion of the layer or substrate.

As shown in the figures, the term "topside" refers to the upper surface of a structure or device and the term "backside" refers to the bottom surface of a structure or device. It should be understood that the substrate also has a "topside" and a "backside." When processing a typical structure, layer(s) are grown from the topside of the substrate and the resulting upper growth surface defines the topside of the structure or device. In some cases, during use, a device may be flipped so that its backside faces upward and its topside faces downward (e.g., See FIG. 20). In these "flip chip" embodiments, the topside of the device may be mounted to another surface (e.g., to provide a source of power to electrodes on the topside).

In certain preferred embodiments, substrate 12 is a silicon substrate. As used herein, silicon substrate 14 refers to any substrate that includes a silicon layer. Examples of suitable silicon substrates include substrates that are composed entirely of silicon (e.g., bulk silicon wafers), silicon-on-insulator (SOI) substrates, silicon-on-sapphire substrate (SOS), and SIMOX substrates, amongst others. Suitable silicon substrates also include substrates that have a silicon wafer bonded to another material such as diamond, AlN, or other polycrystalline materials. Silicon substrates having different crystallographic orientations may be used. In some cases, silicon (111) substrates are preferred. In other cases, silicon (100) substrates are preferred.

It should be understood that in other embodiments, substrates other than silicon substrates may be used such as sapphire and silicon carbide substrates.

Substrate 12 may have any suitable dimensions and its particular dimensions are dictated by the application. Suitable diameters include, but are not limited to, 2 inches (50 mm), 4 inches (100 mm), 6 inches (150 mm), and 8 inches (200 mm). In some embodiments, silicon substrate 12 is relatively thick, for example, greater than 250 microns. Thicker substrates are generally able to resist bending which can occur, in some cases, in thinner substrates. In some embodiments, silicon substrate 12 is preferably thin, for example less than 250 microns, or less than 100 microns, to facilitate the formation of via 24 therethrough.

Transition layer 15 may be formed on substrate 12 prior to the deposition of gallium nitride material device region 14, for example, to accomplish one or more of the following: reducing crack formation in gallium nitride material device region 14 by lowering thermal stresses arising from differences between the thermal expansion rates of gallium nitride materials and the substrate; reducing defect formation in gallium nitride material device region 14 by lowering lattice stresses arising from differences between the lattice constants of gallium nitride materials and the substrate; and, increasing conduction between substrate 12 and gallium nitride material device region 14 by reducing differences between the band gaps of substrate 12 and gallium nitride materials. The presence of transition layer 15 may be particularly preferred when utilizing silicon substrates because of the large differences in thermal expansion rates and lattice constant between gallium nitride materials and silicon. It should be understood that transition layer 15 also may be formed between substrate 12 and gallium nitride material device region for a variety of other reasons. As noted above, transition layer 15 may be non-conducting, although, in some cases, transition layer 15 may be conducting.

The composition of transition layer 15 depends, at least in part, upon the type of substrate and the composition of gallium nitride material device region 14. In some embodiments which utilize a silicon substrate, transition layer 15 may preferably comprise a compositionally-graded transition layer having a composition that is varied across at least a portion of the layer. Suitable compositionally-graded transition layers, for example, have been described in commonly-owned, U.S. Pat. No. 6,649,287, entitled "Gallium Nitride Materials and Methods," filed on Dec. 14, 2000, which is incorporated herein by reference.

Compositionally-graded transition layers are particularly effective in reducing crack formation in gallium nitride material device region 14 by lowering thermal stresses that result from differences in thermal expansion rates between the gallium nitride material and substrate 12 (e.g., silicon). In some embodiments, when compositionally-graded, transition layer 15 is formed of an alloy of gallium nitride such as $Al_xIn_yGa_{(1-x-y)}N$, $Al_xGa_{(1-x)}N$, or $In_yGa_{(1-y)}N$. In these embodiments, the concentration of at least one of the elements (e.g., Ga, Al, In) of the alloy is typically varied across at least a portion of the cross-sectional thickness of the layer.

In other embodiments, transition layer 15 has a constant (i.e., non-varying) composition across its thickness. Such layers may be referred to as buffer layers and/or intermediate layers. Suitable intermediate layers, for example, have been described in U.S. Pat. No. 6,649,287, referenced above. In some embodiments, transition layer 15 has a constant composition of a gallium nitride alloy (such as $Al_xIn_yGa_{(1-x-y)}N$, $Al_xGa_{(1-x)}N$, or $In_yGa_{(1-y)}N$), aluminum nitride, or an aluminum nitride alloy.

Figure 2:
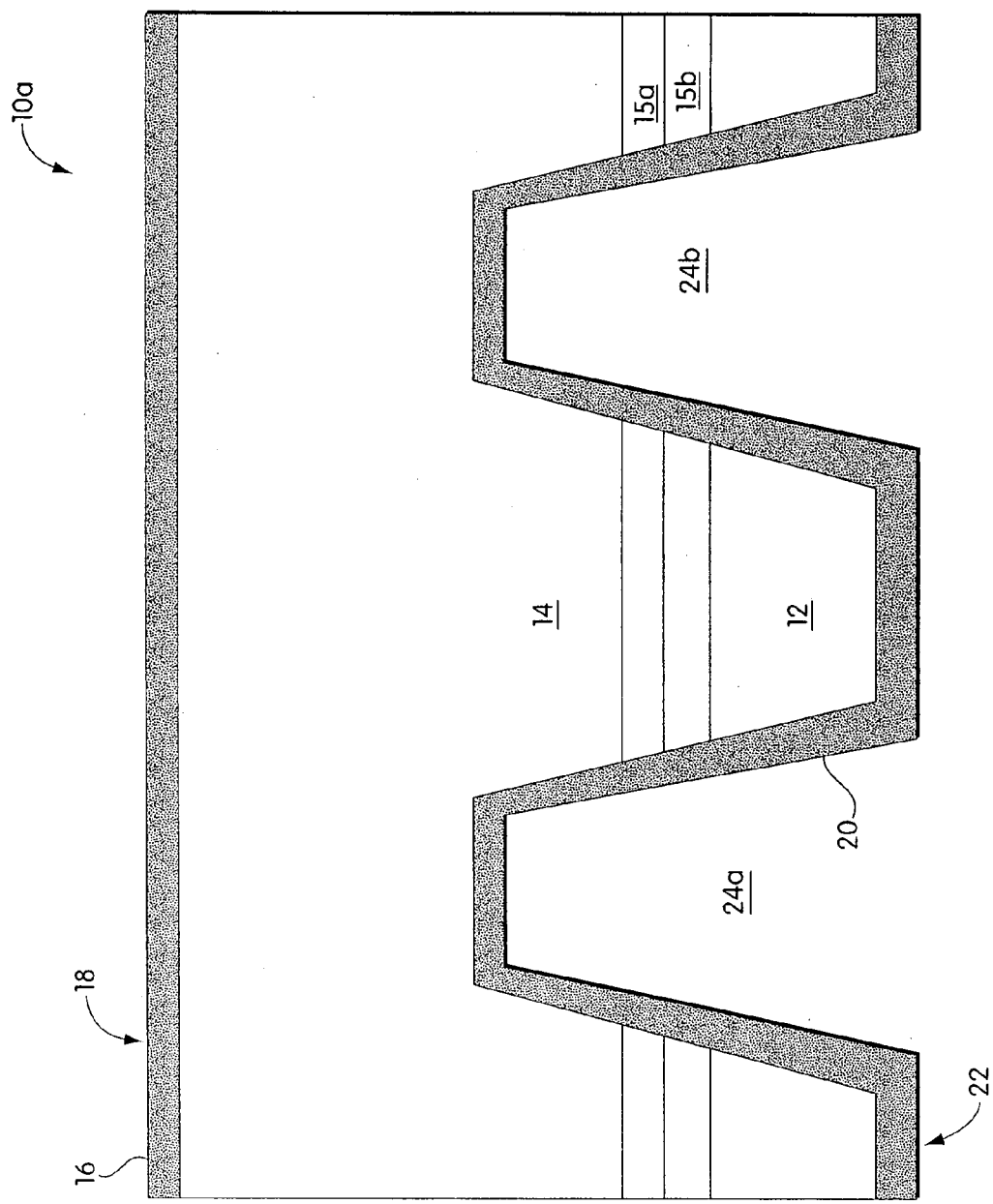
FIG. 2 illustrates a semiconductor device including multiple backside vias according to another embodiment of the present invention.

In the illustrative embodiment of FIG. 1, a single transition layer 15 is shown between substrate 12 and gallium nitride material device region 14. Other embodiments may include more than one transition layer. For example, as shown in FIG. 2, device 10a may include a compositionally-graded transition layer 15a formed on (in some cases, directly on) a transition layer 15b having a constant composition (e.g., an intermediate layer of a gallium nitride alloy, aluminum nitride, or an aluminum nitride alloy). It should also be understood that constant composition transition layer 15b may be formed on (in some cases, directly on) compositionally-graded transition layer 15a. In some cases, the device may include two constant composition transition layers—for example, a first formed on the compositionally-graded transition layer and a second formed on the substrate under the compositionally-graded transition layer.

It also should be understood that in some embodiments, one or more other types of layers (including conducting layers) may be present between substrate 12 and gallium nitride material device region 14 which may accomplish one or more of the above-described features of the transition layer. In some cases, the transition layer is the sole layer between the substrate and the gallium nitride material device region. In embodiments, that include one or more conducting layer, the structure may not include any non-conducting layers.

In the embodiment of FIG. 1, via 24 extends through transition layer 15 of substrate 12 so that vertical conduction can occur in device 10 even when the transition layer is non-conducting. Thus, in these embodiments, at a minimum, via 24 has a length (L) sufficient to create a conducting vertical path between topside contact 16 and backside contact 20. Via 24, for example, may extend to a position within gallium nitride material device region 14 to form such a conducting path. In some cases, it may be preferable to have via 24 extend to an etch-stop layer (e.g., See 46, FIG. 5) within gallium nitride material device region 14, to facilitate processing as described further below. In certain embodiments, via 24 may extend to a position below gallium nitride material device layer—for example, within an upper portion of a doped, conductive transition layer and, thus, a vertical conducting path is formed. In some cases, via 24 may extend to a source region or a drain region formed within device 10.

The exact dimensions and shape of via 24 depend upon the application. A typical cross-sectional area of via is about 100 microns by about 100 microns at backside 22. The cross-sectional area of the via may be square (as shown in FIG. 22), circular or another shape. It may be preferable for via 24 to be tapered inward, as shown, thus giving the via a cone shape (i.e., a truncated pyramid shape). The inward taper (i.e., a cross-sectional area that decreases in a direction away from the backside) can facilitate deposition of backside contact 20 on side walls 28 of via 24 and may also, in some cases, be beneficial for enhancing light extraction. In other cases, as described further below and shown in FIG. 10, it may be preferable for the via to be tapered outward (i.e., a cross-sectional area that increases in a direction away from the backside). An outwardly tapered via may enhance internal light reflection which can improve light extraction in certain embodiments. In some cases, it may be preferable to have via 24 positioned away from sides 29 of the device. That is, the via does not intersect with a side of the device.

In FIG. 1, device 10 includes a single via 24. Other embodiments, however, as described further below and shown in FIGS. 2-3, may include more than one via.

As used herein, the phrase "electrical contact" or "contact" refers to any conducting structure on a semiconductor device that is designed to be contacted by a power source. "Contacts" may also be referred to as electrodes, terminals, contact pads, contact areas, contact regions and the like. It should be understood that certain types of conducting structures that are on, or part of, a semiconductor device are not electrical contacts, as used herein. For example, conducting regions or layers (e.g., reflector layer 120 in some cases) that are not contacted by a power source during use are not electrical contacts as defined herein.

Backside contact 20 and topside contact 16 are formed of conducting materials including certain metals. Any suitable conducting material known in the art may be used. The composition of contacts 16, 20 may depend upon the type of contact. For example, contacts 16, 20 may contact n-type material or p-type material. Suitable metals for n-type contacts include titanium, nickel, aluminum, gold, copper, and alloys thereof. Suitable metals for p-type contacts include nickel, gold, and titanium, and alloys thereof.

Contacts 16, 20 have a thickness sufficient to ensure that the contact is electrically conductive across its entire physical area. Suitable thicknesses for contacts 16, 20, for example, are between about 0.05 microns and about 10 microns. In some cases, the thickness of backside contact 20 may vary over its area because of uneven deposition on side walls 28 of via 24. The surface areas of backside contact 20 and topside contact 16 are generally sufficient so that the contacts can be contacted by terminals of an appropriate power source through wire bonding, air bridging and the like. In certain preferred embodiments, backside contact 20 substantially extends only over backside and does not, for example, extend over sides 30 of device 10. Thus, in these preferred embodiments, sides 30 are substantially free of backside contact 20.

In some embodiments, as described further below, semiconductor structure may include one or more backside contact and no topside contact (e.g., FIG. 3), or one or more topside contact (e.g., two for light emitting devices or three for FETs) and no backside contact (e.g., FIGS. 13-16).

In some embodiments, contacts 16, 20 also may function as an effective heat sink. In these embodiments, contacts 16, 20 remove thermal energy generated during the operation of the device. This may enable device 10 to operate under conditions which generate amounts of heat that would otherwise damage the device. In particular, laser diodes that operate at high current densities may utilize contacts 16, 20 as a heat sink. Contacts 16, 20 may be specifically designed to enhance thermal energy removal. For example, contacts 16, 20 may be composed of materials such as copper and gold, which are particularly effective at removing heat. Also, contacts 16, 20 may be designed so that a large surface area is in contact with device region 14—for example, by including multiple vias and/or vias that extend significantly into device region 14.

In some embodiments, such as when device 10 is an opto-electronic device, contacts 16, 20 can function as a reflector region (e.g., 120a, FIG. 19), as described further below. By reflecting light generated by the device, contacts 16, 20 can direct the light in a desired direction, for example, out of topside 18, backside 22, and/or sides 30 of device 10 depending on the design of the device. Thus, the output efficiency of the device may be enhanced. In particular, laser diodes and light emitting diodes can benefit from utilizing the reflective properties of contacts 16, 20. To enhance the ability of backside contact 20 to reflect light, for example, via 24 is formed such that the backside contact extends proximate an active region (e.g., 38, FIG. 4; 50, FIG. 5).

As used herein, the term "active region," when used in connection with a light emitting device, refers to a light generating region, and when used in connection with a light detecting device refers to a light collecting region.

In certain embodiments, and as described further below in connection with FIGS. 9-11, 13-14, and 16-18, it may be preferable for via 24 to be free of a contact. That is, a contact is not formed within the via. In some cases, the via may be free of a contact but may have one or more other region(s) or layer(s) formed therein (e.g., a reflective layer), as described further below. In some cases, the via may be free of any material formed therein. When free of material, the via may function as a window that exposes internal layers of the device (e.g., transition layer 15 or gallium nitride material device region 14) to the outside. This exposure may enhance the extraction of light from the device which can be particularly useful in light-emitting devices such as LEDs or lasers. In embodiments in which via 24 is free of an electrical contact, it should be understood that contacts are formed on other parts of the device including other (non-via) areas of backside 22 or areas of topside 18.

Figure 12:
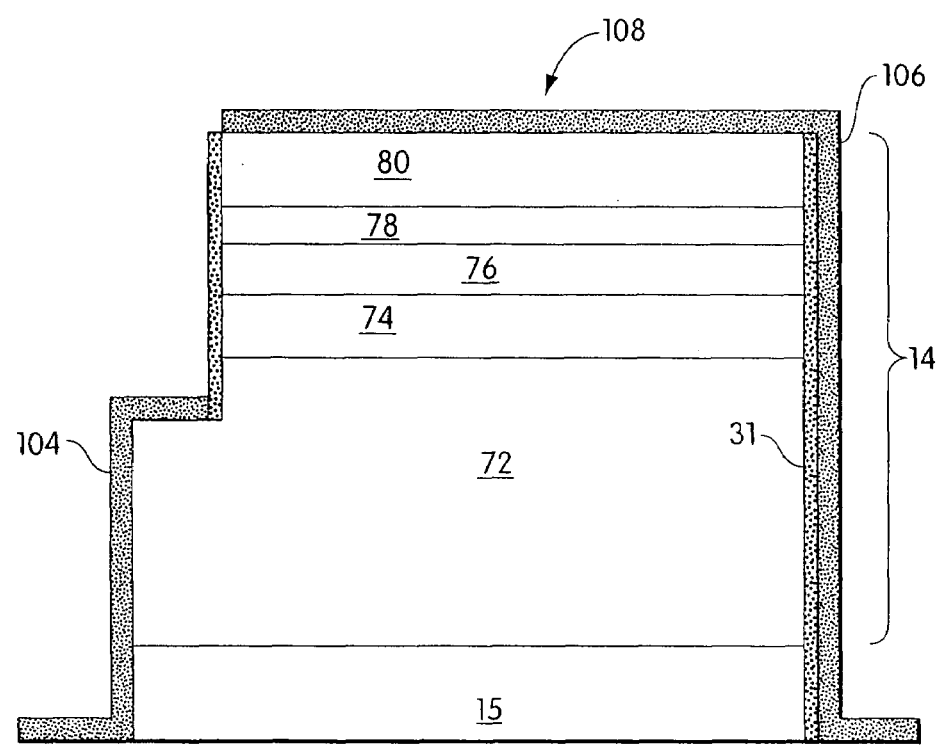
FIG. 12 illustrates a semiconductor device after the substrate has been removed during processing according to another embodiment of the present invention.
Figure 15:
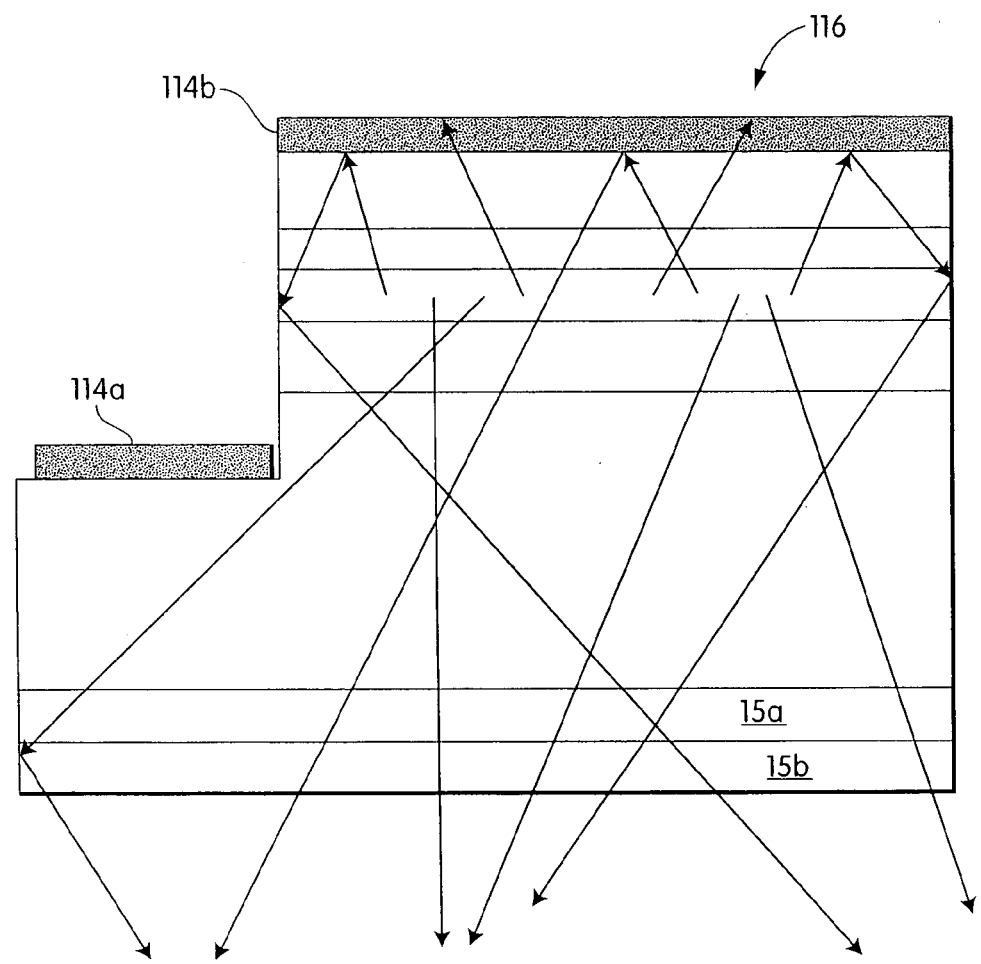
FIG. 15 illustrates a light emitting device after the substrate has been removed during processing according to another embodiment of the present invention.
Figure 25:
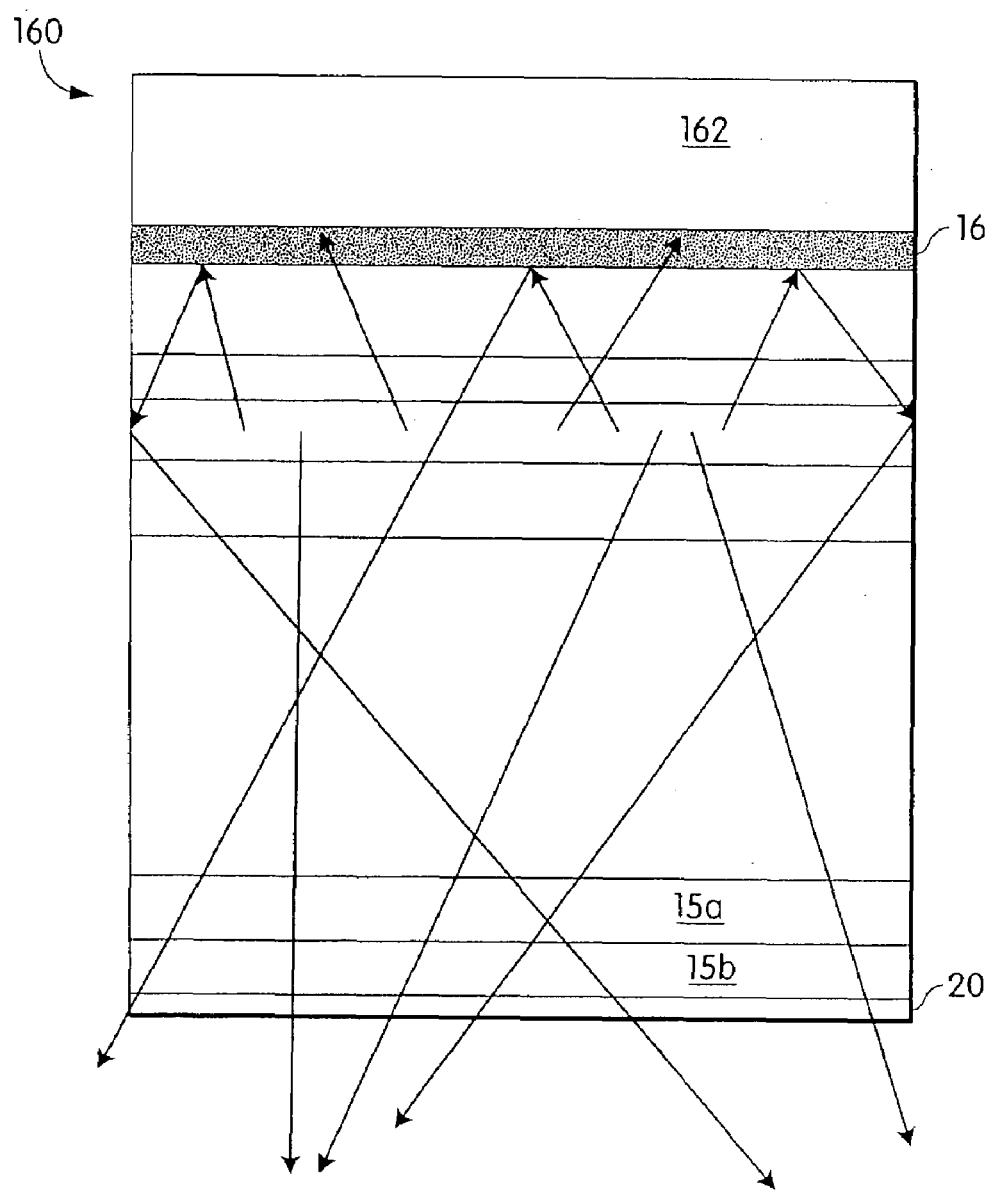
FIG. 25 illustrates a light emitting device that is mounted to a carrier according to another embodiment of the present invention.
Figure 26:
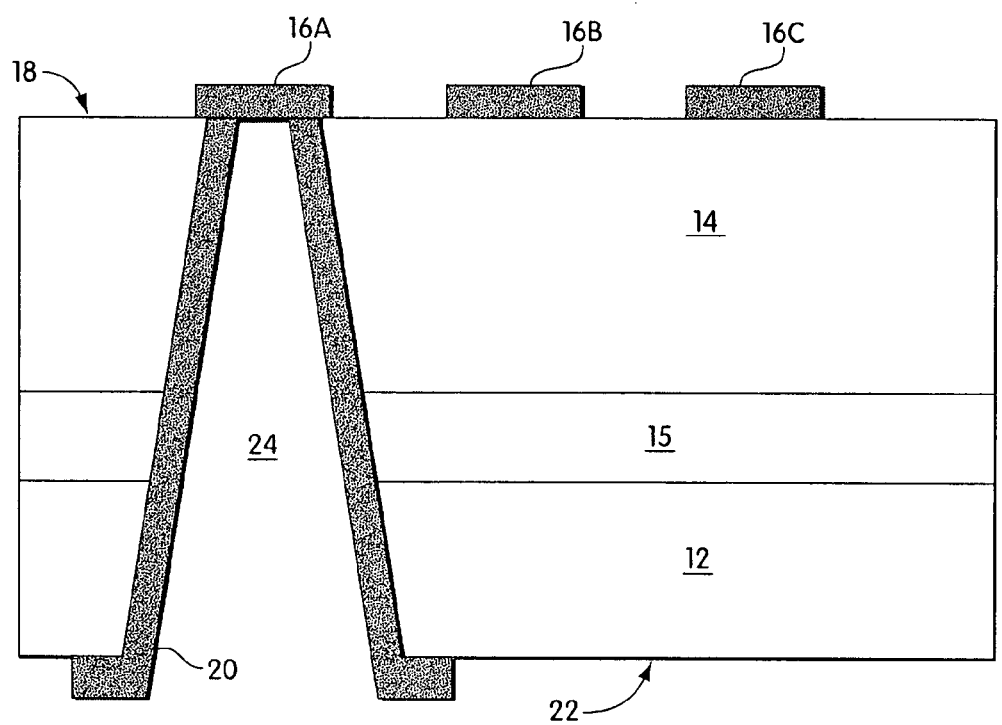
FIG. 26 illustrates a semiconductor device according to an embodiment of the invention.

In some cases, to maximize exposure of the internal device layers, substrate 12 may be entirely removed, for example, by etching (wet or dry) or grinding. Such a device is shown in FIGS. 12, 15 and 25, and described further below. When the substrate is entirely removed, it may be desirable to mount, or bond, the structure to a carrier which may be a wafer (e.g., silicon or GaAs) that provides rigidity and/or support during further processing, handling, or use. The rigidity and/or support provided by the carrier result from its relatively large thickness compared to the thickness of the remaining structure. In some cases, carriers may also function as a reflector region.

Gallium nitride material device region 14 comprises at least one gallium nitride material layer. In some cases, gallium nitride material device region 14 includes only one gallium nitride material layer. In other cases, as described further below and shown in FIGS. 4-8, gallium nitride material device region 14 includes more than one gallium nitride material layer. The different layers can form different regions of the semiconductor structure. Gallium nitride material region 14 also may include one or more layers that do not have a gallium nitride material composition such as other III-V compounds or alloys, oxide layers, and metallic layers.

As used herein, the phrase "gallium nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_x In_yGa_{(1-x-y)}N$), gallium arsenide phosporide nitride ($GaAs_aP_b N_{(1-a-b)}$), aluminum indium gallium arsenide phosporide nitride ($Al_xIn_yGa_{(1-x-y)}As_aPb N_{(1-a-b)}$), amongst others. Typically, when present, arsenic and/or phosphorous are at low concentrations (i.e., less than 5 weight percent). In certain preferred embodiments, the gallium nitride material has a high concentration of gallium and includes little or no amounts of aluminum and/or indium. In high gallium concentration embodiments, the sum of (x+y) may be less than 0.4, less than 0.2, less than 0.1, or even less. In some cases, it is preferable for the gallium nitride material layer to have a composition of GaN (i.e., x+y =0). Gallium nitride materials may be doped n-type or p-type, or may be intrinsic. Suitable gallium nitride materials have been described in U.S. Pat No. 6,649,287, incorporated herein.

Gallium nitride material region 14 is of high enough quality so as to permit the formation of devices therein. Preferably, gallium nitride material region 14 has a low crack level and a low defect level. As described above, transition layer 15 may reduce crack and/or defect formation. In some embodiments, gallium nitride material region 14 has about $10^9$ defects/cm$^2$. Gallium nitride materials having low crack levels have been described in U.S. Pat. No. 6,649,287, referenced above. In some cases, gallium nitride material region 14 has a crack level of less than 0.005 µm/µm$^2$. In some cases, gallium nitride material has a very low crack level of less than 0.001 µm/µm$^2$. In certain cases, it may be preferable for gallium nitride material region 14 to be substantially crack-free as defined by a crack level of less than 0.0001 µm/µm$^2$.

In certain cases, gallium nitride material region 14 includes a layer or layers which have a monocrystalline structure. In some preferred cases, gallium nitride material region 14 includes one or more layers having a Wurtzite (hexagonal) structure.

The thickness of gallium nitride material device region 14 and the number of different layers are dictated, at least in part, by the requirements of the specific application. At a minimum, the thickness of gallium nitride material device region 14 is sufficient to permit formation of the desired device. Gallium nitride material device region 14 generally has a thickness of greater than 0.1 micron, though not always. In other cases, gallium nitride material region 14 has a thickness of greater than 0.5 micron, greater than 0.75 micron, greater than 1.0 microns, greater than 2.0 microns, or even greater than 5.0 microns.

Figure 16:
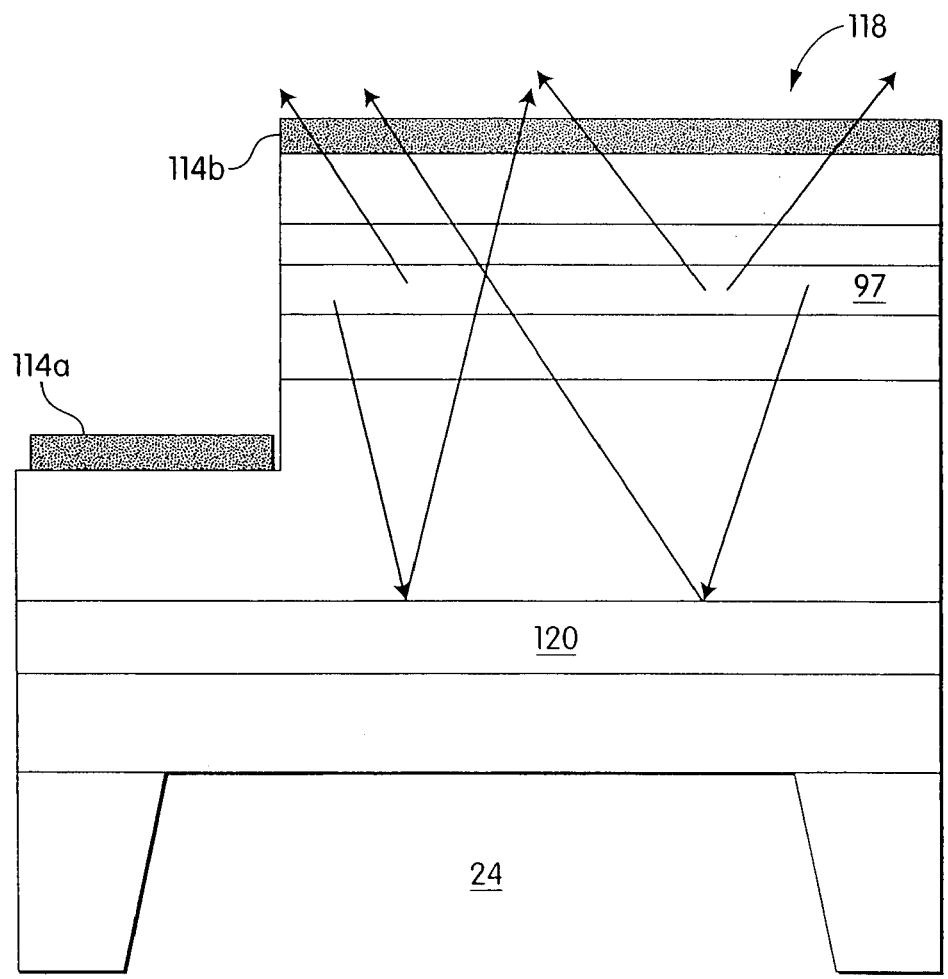
FIG. 16 illustrates a light emitting device including a reflector region according to another embodiment of the present invention.

When device 10 is a light-emitting device, it may also include a reflector region 120 (See FIG. 16). Reflector region 120 increases the reflectivity of an interface and typically directs or steers the light in a desired location or direction within a light-emitting device. The composition and structural characteristics (e.g., thickness) of the reflector region may be selected to reflect the desired wavelength (or range or wavelengths) of light.

Reflector region 120 may be a single layer or a series of layers. In some cases, reflector region 120 comprises a metal. In other cases, reflector region 120 may comprise a dielectric or semiconductor material. In these cases, typically, multiple dielectric or semiconductor material layers are stacked to form the reflector region. One example of a multi-layer reflector region is a Distributed Bragg Reflector (DBR). A DBR has at least two layers of different compositions (e.g., gallium nitride alloys or oxide-based compounds).

The location of the reflector region in the device is selected so as to reflect light in the desired direction. Typically, the position of the reflector region is selected relative to the light emitting region(s) of the device. For example, if it is desired to reflect light in the direction of the backside of the device, reflector region 120 is preferably located above an active region (e.g., 97, FIG. 17) in which light is generated. If it is desired to reflect light in the direction of the topside of the device, reflector region 120 is preferably located below the active region (e.g., 97, FIG. 16). In some cases, such as when the device is a laser, reflector region 120 may located both above and below an active region. Depending on the device design, reflector region 120 may be a portion of the gallium nitride material region 14, or may be located above or below the gallium nitride material region. As noted above, in some cases, reflector region 120 may be an electrical contact, though other types of electrical contacts are not reflector regions. In embodiments in which the reflector region also functions as an electrical contact, the reflector region, for example, may be formed of aluminum, silver or rhodium.

Device 10 may be formed using known processing techniques. Transition layer 15 and gallium nitride material device region 14 may be deposited on substrate 12, for example, using metalorganic chemical vapor deposition (MOCVD), molecular beam epitaxy (MBE), and hydride vapor phase epitaxy (HVPE), amongst other techniques. In some cases, an MOCVD process may be preferred. A suitable MOCVD process to form a compositionally-graded transition layer 15 and gallium nitride material device region 14 over a silicon substrate 12 has been described in U.S. Pat. No. 6,649,287, referenced above. When gallium nitride material device region 14 has different layers, in some cases it is preferable to use a single deposition step (e.g., an MOCVD step) to form the entire device region 14. When using the single deposition step, the processing parameters are suitably changed at the appropriate time to form the different layers. In certain preferred cases, a single growth step may be used to form transition layer 15 and gallium nitride material device region 14.

When present, reflector region 120 may also be formed using known processing techniques. For example, when the reflector region comprises a metal, the metal may be sputtered or evaporated. When the reflector region comprises a series of semiconductor material layers, the layers may be deposited using metalorganic chemical vapor deposition (MOCVD), molecular beam epitaxy (MBE), and hydride vapor phase epitaxy (HVPE), amongst other techniques. When the reflector region comprises a series of dielectric material layers, the layers may be deposited by chemical vapor deposition (CVD) or sputtering.

In some cases, it may be preferable to grow device region 14 using a lateral epitaxial overgrowth (LEO) technique that involves growing an underlying gallium nitride layer through mask openings and then laterally over the mask to form the gallium nitride material device region, for example, as described in U.S. Pat. No. 6,051,849, which is incorporated herein by reference. In some cases, it may be preferable to grow device region 14 using a pendeoepitaxial technique that involves growing sidewalls of gallium nitride material posts into trenches until growth from adjacent sidewalls coalesces to form a gallium nitride material region, for example, as described in U.S. Pat. No. 6,177,688, which is incorporated herein by reference. In these lateral growth techniques, gallium nitride material regions with very low defect densities are achievable. For example, at least a portion of gallium nitride material region 14 may have a defect density of less than about $10^5$ defects/cm$^2$.

Conventional etching techniques may be used to form via 24. Suitable techniques include wet chemical etching and plasma etching (i.e., RIE, ICP etching, amongst others). Different etching techniques may be utilized when etching through different layers of device 10. For example, a fluorine-based RIE process may be used to etch through substrate 12 and a chlorine-based RIE process may be used to etch through gallium nitride device region 14 and/or transition layer 15. A pre-determined etching time may be used to form via 24 with the desired dimensions. In other cases, an etch stop layer (e.g., See 46, FIG. 5), which has a composition that is not readily etched by the technique being used, may be provided within device 10 to stop etching so that precise control over the etching time is not required to form via 24 with desired dimensions.

Backside contact 20 and topside contact 16 may be deposited using known techniques suitable for depositing conducting materials such as metals. Such techniques include sputtering, electron beam deposition, and evaporation, amongst others. In some cases, a series of layers having different metallic compositions are deposited successively to form contacts 16, 20. In some of these cases, an annealing technique is used to yield equilibration of the contact composition. Because backside contact 20 is deposited within via 24, the deposition technique should be performed in a manner that provides sufficient coverage within via 24.

As known in the semiconductor art, multiple device structures may be formed on the same wafer of substrate material. A dicing operation, which utilizes a saw, may be used to separate individual devices from one another. In embodiments using silicon substrates, devices may be separated in an etching process (e.g., wet or dry) which etches through the substrate and layers. This etching process may use different etch chemistries when etching through different layers of the structure and substrate. For example, a fluorine-based gas may be used to etch through the silicon substrate and a chlorine-based gas may be used to etch through gallium nitride device region 14 and/or transition layer 15. Separation using an etching process can enable formation of devices having non-rectangular die shapes (See FIGS. 23C-23K) which may be advantageous in certain light emitting applications, as described further below.

FIG. 2 illustrates device 10a which includes multiple vias 24a, 24b according to another embodiment of the present invention. A single backside contact 20 is formed in and across both vias 24a, 24b. Using multiple vias 24a, 24b as shown in FIG. 2 may enhance heat removal, improve light reflection, and increase vertical conduction. As noted above, device 10a also includes a compositionally-graded transition layer 15a formed on a constant composition transition layer 15b. It should be understood that device 10a is not limited to this transition layer arrangement and that other transition layer(s) described herein are possible including a single transition layer.

Figure 3:
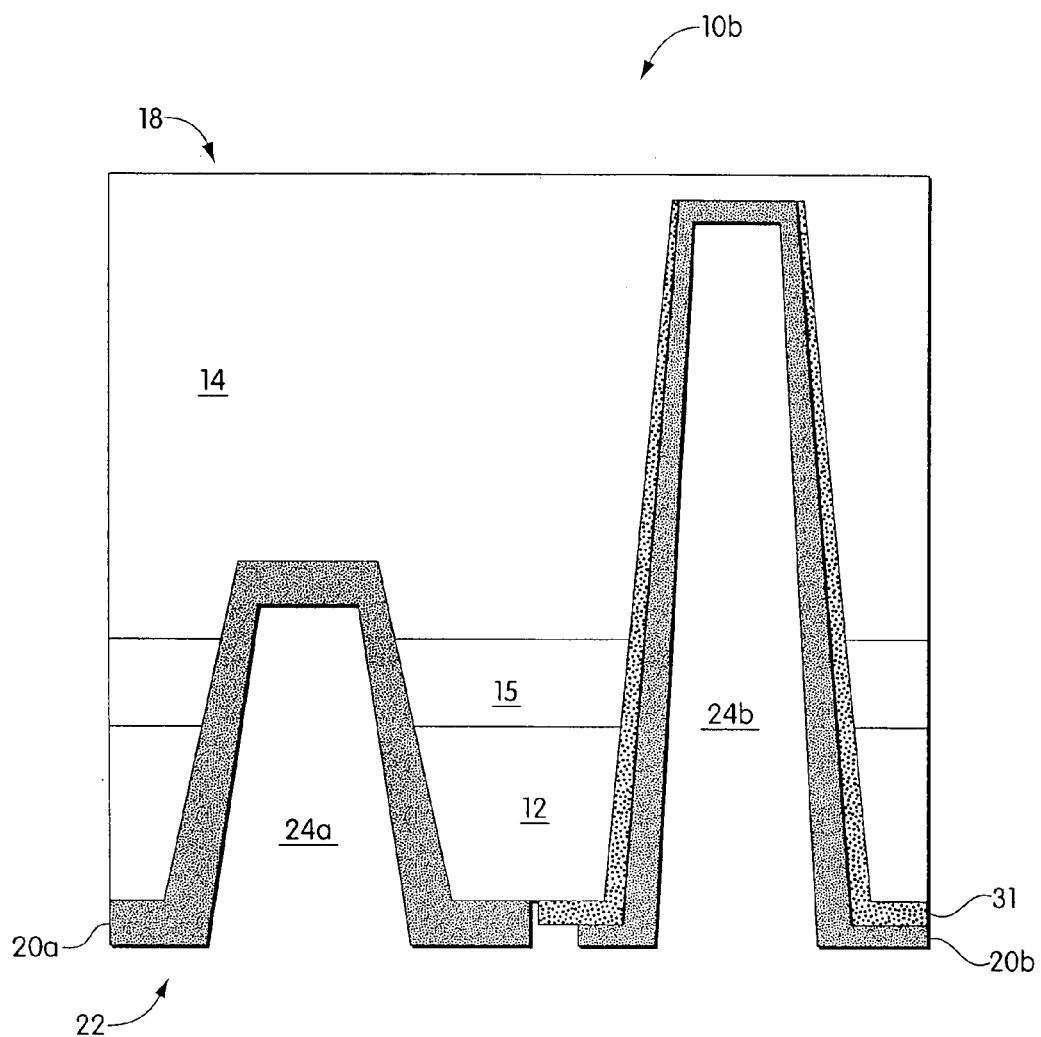
FIG. 3 illustrates a semiconductor device including multiple backside vias and no topside vias according to another embodiment of the present invention.

FIG. 3 illustrates device 10b including multiple vias 24a, 24b according to another embodiment of the present invention. A first backside contact 20a is formed in via 24a and a second backside contact 20b is formed in via 24b. A dielectric layer 31 may be used, for example, to electrically isolate portions of backside contact 20b to prevent shorting of device 10. Suitable compositions for dielectric layer 31 include silicon oxide and silicon nitride. The embodiment of FIG. 3 does not have a topside contact (16 in FIG. 1). The embodiment of FIG. 3 may be utilized in cases when it is not desirable to have a topside contact such as for surface mounted devices.

It should be understood that the invention also includes devices having backside vias and backside contacts with other configurations than those illustrated herein. For example, backside contact 20 may extend to an active region within gallium nitride material device region 14, such as a source region or a drain region. Also, backside contact 20 may extend substantially through the thickness of the device so that the backside contact also forms a contact on topside 18 of the device.

Figure 13:
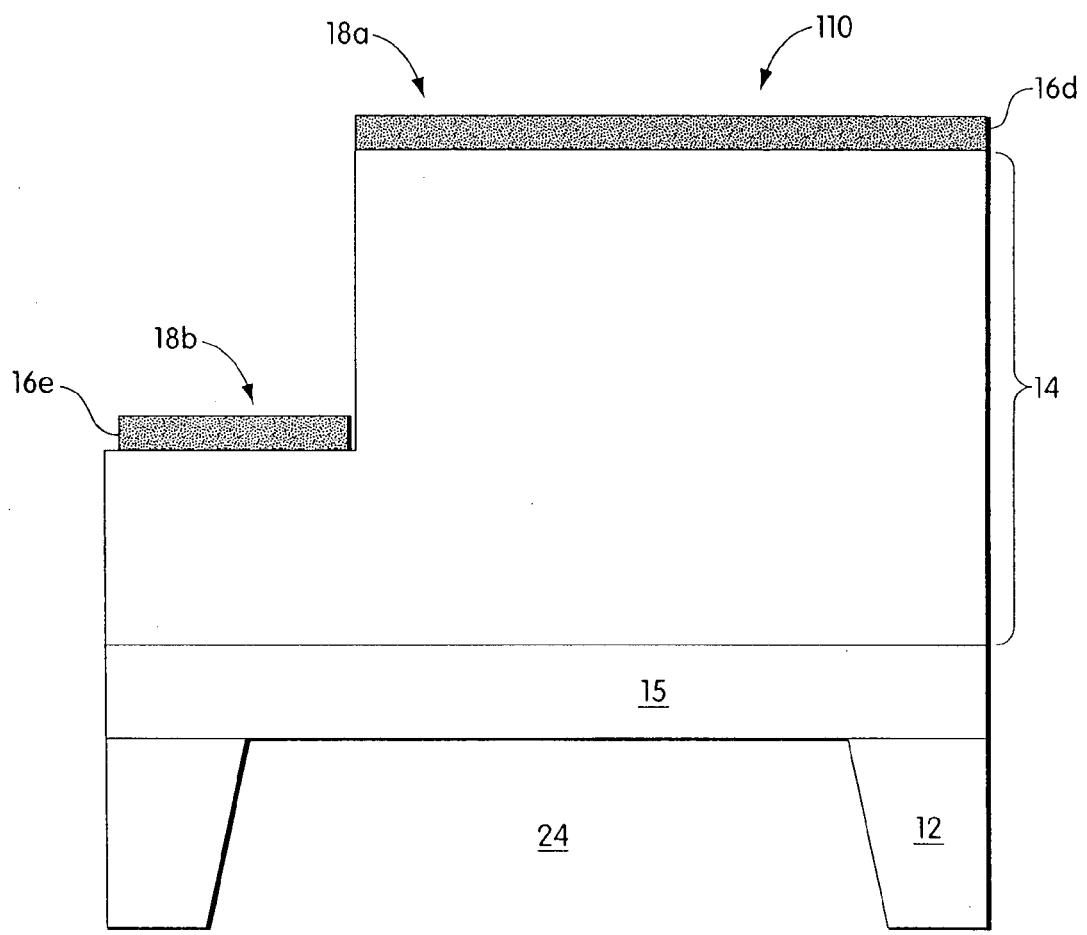
FIG. 13 illustrates a light emitting device that includes two topside contacts according to another embodiment of the present invention.

It should also be understood that certain embodiments of the invention do not include a backside contact 20 as shown in FIG. 13. Device 110 includes a first topside contact 16d and a second topside contact 16e. As shown, first topside contact 16d is formed on a first topside portion 18a of gallium nitride material region 14 and second topside contact 16e is formed on a second topside portion 18b of the gallium nitride material region, wherein the first topside portion and the second topside portion are on different planes. In other cases, first and second topside contacts are formed on the same plane. It may be advantageous to include multiple topside contacts and no backside contacts, for example, when the topside of the device is mounted to a surface (e.g., in flip-chip embodiments). Also, it may be advantageous to include multiple topside contacts and no backside contacts in certain light emitting devices (e.g., LEDs, lasers) when it is desired to emit light out of the backside of the device. The absence of a backside contact, and/or any other material, in backside via 24 of device 110 can enhance light emission, amongst other advantages.

It should be understood that devices of the invention may include more than two (e.g., three contacts) topside contacts in certain device configurations (e.g., FETs)

Figure 18:
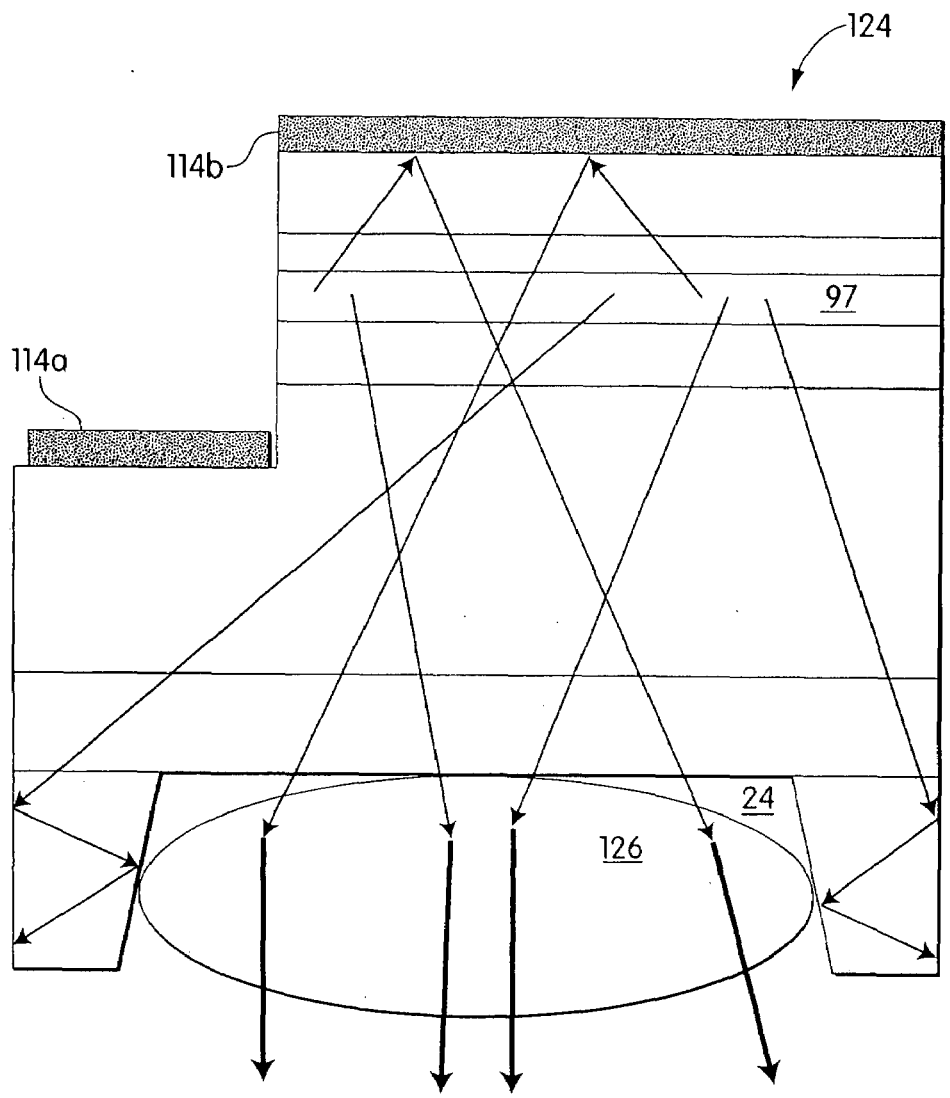
FIG. 18 illustrates a light emitting device including a medium containing phosphor according to another embodiment of the present invention.

FIG. 18 illustrates a light-emitting device 124 that includes a medium 126 comprising phosphor. The medium, for example, may include phosphor dispersed in epoxy. The phosphor may convert light generated within the device to light of a different wavelength. For example, phosphor may be used to convert blue or UV-light generated within the device to white light. It should be understood that light emitting device 124 may have any suitable layer arrangement including layer arrangements of the LED embodiments described herein Any suitable semiconductor device known in the art including electronic and opto-electronic devices may utilize features of the invention. In many cases, the device may be formed entirely within gallium nitride material region 14 (i.e., the only active device regions are within gallium nitride material region 14). In other cases, the device is formed only in part within gallium nitride material region 14 and is also formed in other regions such as substrate 12.

Exemplary devices include light emitting devices (such as laser diodes (LDs) and light emitting diodes (LEDs)), light detecting devices (such as detectors and sensors), power rectifier diodes, FETs (e.g., HFETs), Gunn-effect diodes, varactor diodes, amongst others. Light-emitting devices of the invention may be designed to emit the desired wavelength of light including visible light (e.g., blue) and UV-light. As described above, the device may also include one or more types of phosphor that converts the light generated within the device to white light. Although certain figures may illustrate certain types of devices, it should be understood that the features of these figures may also be used in other types of devices of the present invention. For example, though FIGS. 13-20 illustrate light emitting devices, it should be understood that features of these figures may also be used in light detecting devices. In such light detecting devices, active region 97 is a light collector region, in contrast to the light generating region shown in some of these figures.

FIGS. 4-8 illustrate examples of gallium nitride material devices according to the invention. It should be understood, however, that devices having other structures are also within the scope of the invention.

Figure 4:
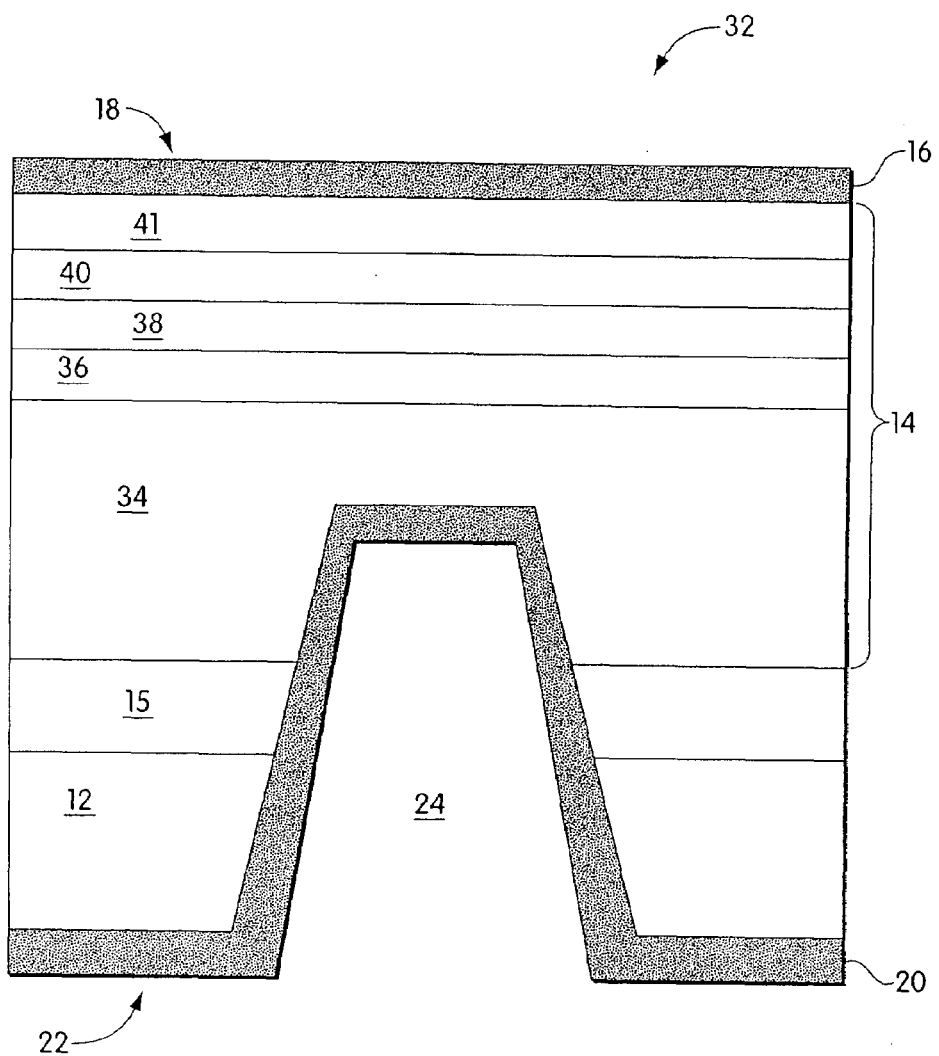
FIG. 4 illustrates an LED according to another embodiment of the present invention.

FIG. 4 illustrates an exemplary LED 32 according to one embodiment of the present invention. LED 32 includes gallium nitride material device region 14 formed on transition layer 15. Transition layer 15 may be compositionally-graded and is formed on silicon substrate 12. In the illustrative embodiment, the following layers comprise gallium nitride material device region 14 in succession: a silicon-doped GaN layer 34, a silicon-doped $Al_xGa_{(1-x)}N$ layer 36 (e.g., containing 0-20% by weight Al), a GaN/InGaN single or multiple quantum well 38, a magnesium-doped $Al_xGa_{(1-x)}N$ layer 40 (e.g., containing 10-20% by weight Al), and a magnesium-doped GaN layer 41. Via 24 extends from backside 22 to a position within GaN layer 34. Topside contact 16 is formed of a metal on a p-type region and backside contact 20 is formed of a metal on an n-type region. LED 32 may be provided as a variety of different structures including: a double heterostructure (e.g., Al>0% in layer 36), a single heterostructure (e.g., Al=0% in layer 36), a symmetric structure, or an asymmetric structure. The LED illustrated in this embodiment is designed to emit visible light (e.g., blue light). It should be understood that LEDs having a variety of different structures may also be provided according to the invention including LEDs that emit UV light (See FIG. 21).

Figure 5:
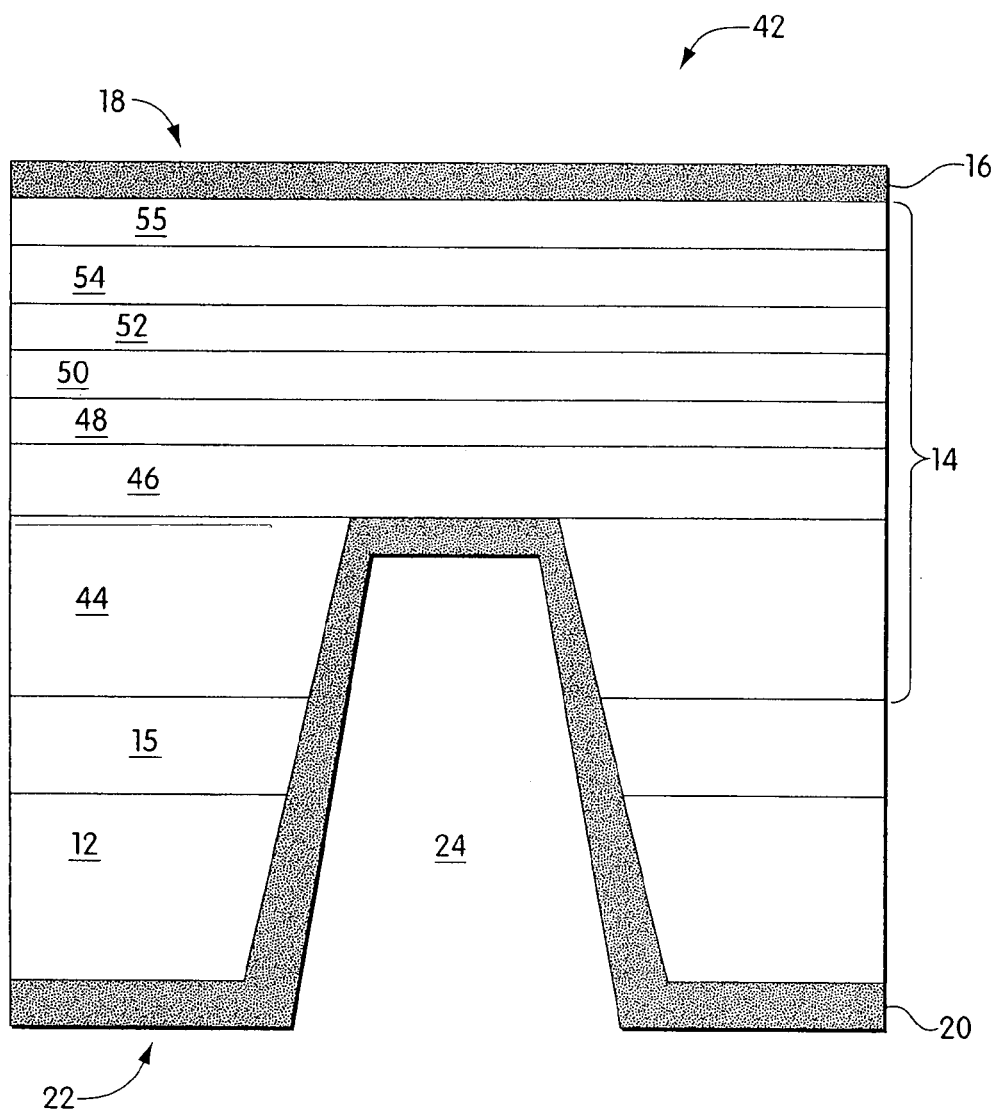
FIG. 5 illustrates a laser diode according to another embodiment of the present invention.

FIG. 5 illustrates an exemplary laser diode 42 according to one embodiment of the present invention. Laser diode 42 includes gallium nitride material device region 14 formed on transition layer 15. Transition layer 15 may be compositionally-graded and is formed on silicon substrate 12. In the illustrative embodiment, the following layers comprise gallium nitride material device region 14 in succession: a silicon-doped GaN layer 44, a silicon-doped $Al_xGa_{(1-x)}N$ layer 46 (e.g., containing 5-30% by weight Al), a silicon-doped $Al_xGa_{(1-x)}N$ layer 48 (e.g., containing 0-20% by weight Al), a GaN/InGaN single or multiple quantum well 50, a magnesium-doped $Al_xGa_{(1-x)}N$ layer 52 (e.g., containing 5-20% by weight Al), a magnesium-doped $Al_xGa_{(1-x)}N$ layer 54 (e.g., containing 5-30% by weight Al), and a magnesium-doped GaN layer 55. Via 24 extends from backside 22 to $Al_xGa_{(1-x)}N$ layer 46 which functions as an etch-stop layer. Topside contact 16 is formed of a p-type metal and backside contact 20 is formed of an n-type metal. It should be understood that laser diodes having a variety of different structures may also be provided.

Figure 6:
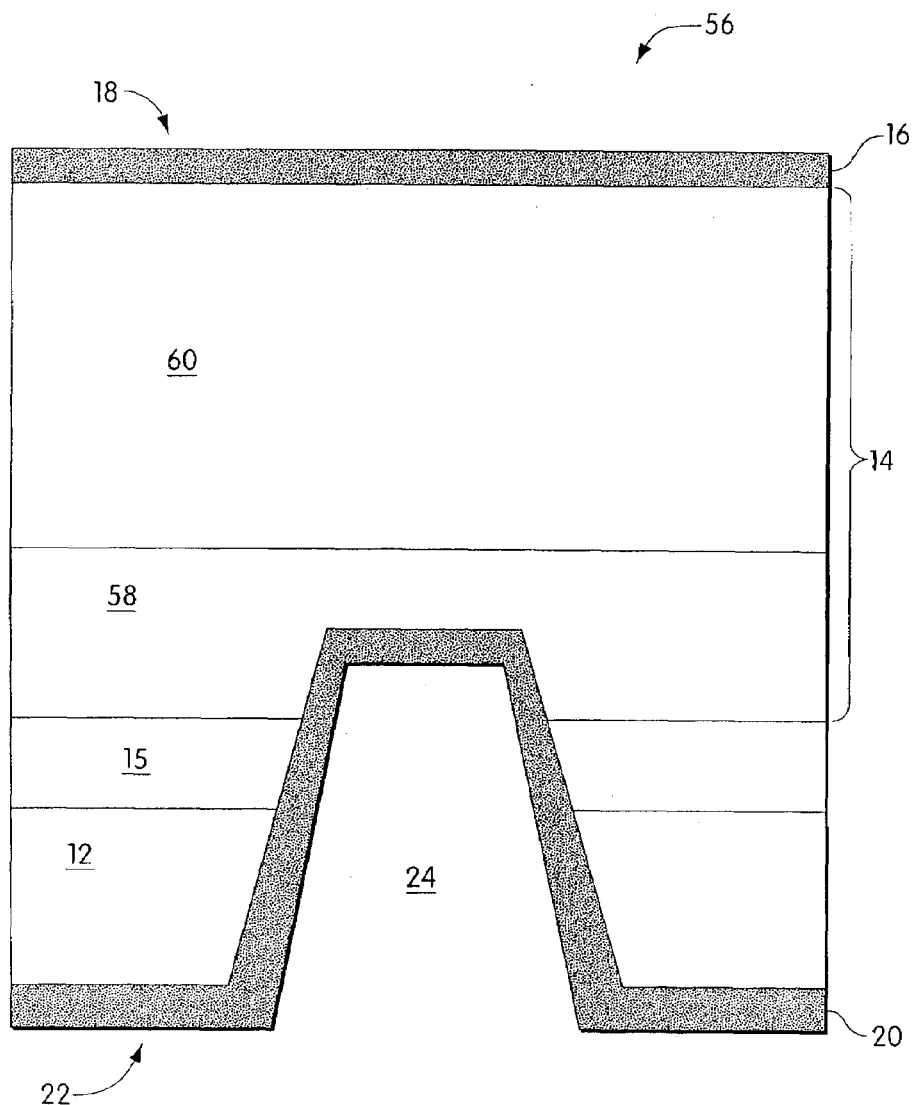
FIG. 6 illustrates a power rectifier diode according to another embodiment of the present invention.

FIG. 6 illustrates a power rectifier diode 56 according to one embodiment of the present invention. Diode 56 includes gallium nitride material device region 14 formed on transition layer 15. Transition layer 15 may be compositionally-graded and is formed on silicon substrate 12. In the illustrative embodiment, the following layers comprise gallium nitride material device region 14 in succession: a silicon-doped GaN layer 58 and an intrinsic GaN layer 60. Via 24 extends from backside 22 to a position within GaN layer 58. Topside contact 16 is formed of a rectifying metal and backside contact 20 is formed of an n-type metal. It should be understood that diodes having a variety of different structures may also be provided.

Figure 7:
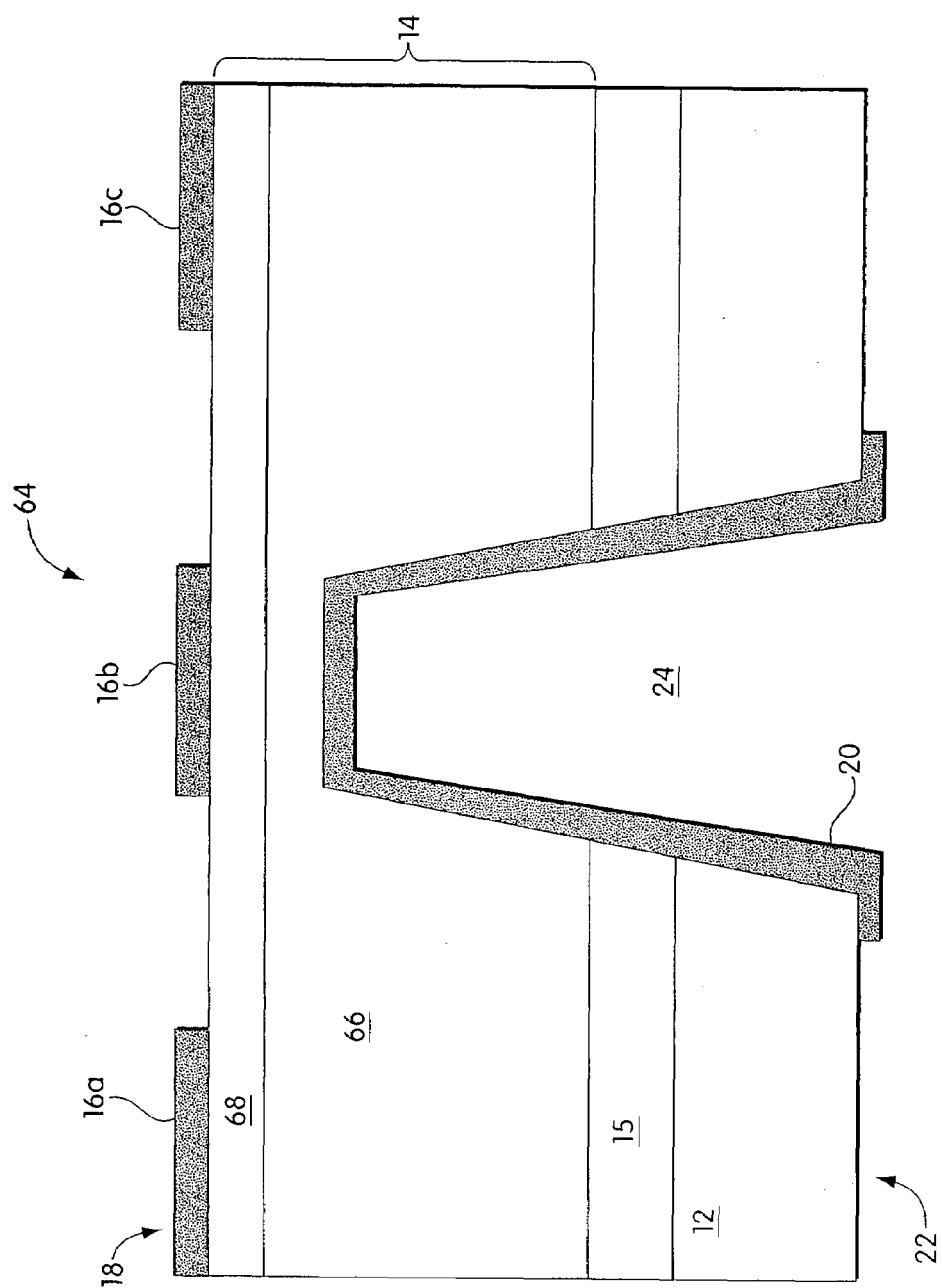
FIG. 7 illustrates a double-gate HFET according to another embodiment of the present invention.

FIG. 7 illustrates a double-gated HFET 64 according to one embodiment of the present invention. HFET 64 includes gallium nitride material device region 14 formed on transition layer 15. Transition layer 15 may be compositionally-graded and is formed on silicon substrate 12. In the illustrative embodiment, the following layers comprise gallium nitride material device region 14 in succession: an intrinsic GaN layer 66 and an intrinsic AlGaN region 68. Via 24 extends from backside 22 to a position within GaN layer 66. HFET 64 includes a source topside contact 16a, a gate topside contact 16b, and a drain topside contact 16c. A backside gate contact 20 is formed within via 24. It should be understood that HFETs having a variety of different structures may also be provided including HFETs having a plurality of gates.

Figure 8:
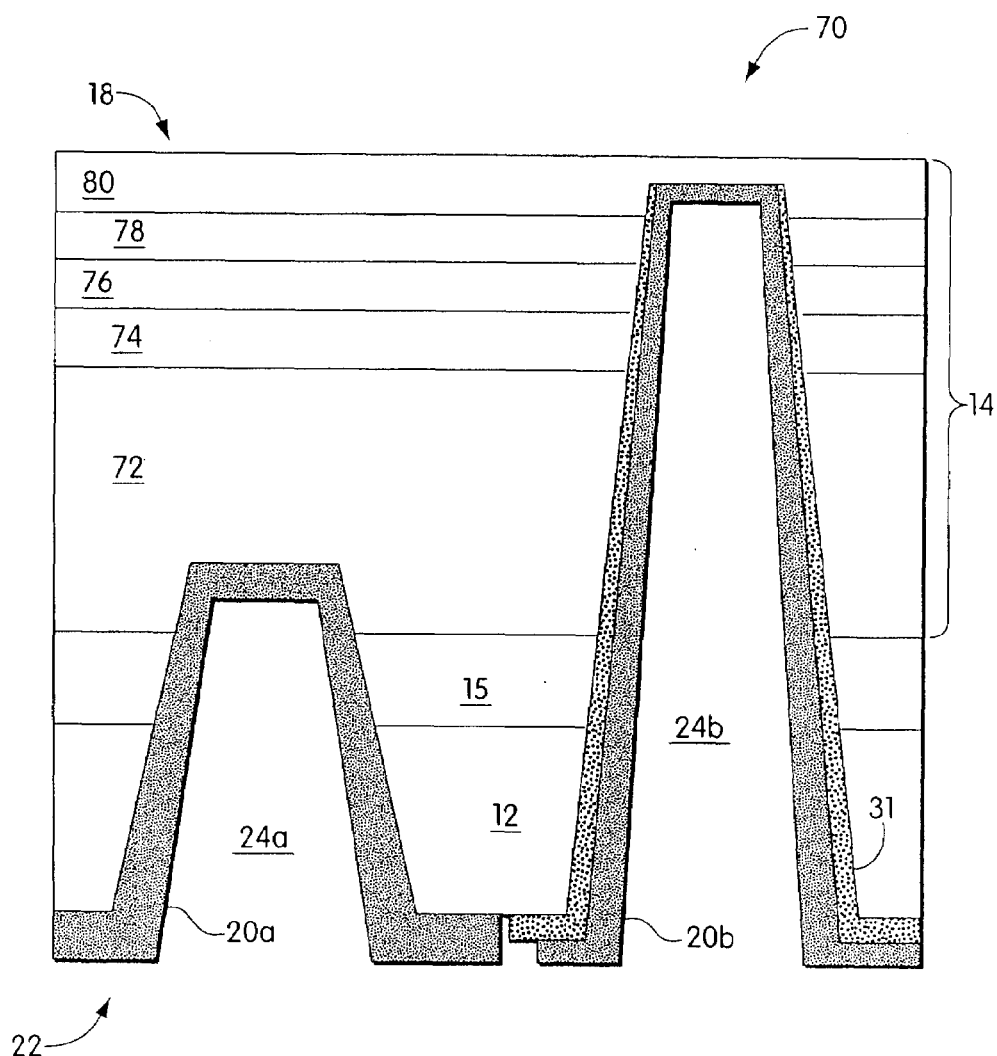
FIG. 8 illustrates an LED including multiple backside vias and no topside vias according to another embodiment of the present invention.

FIG. 8 illustrates an LED 70 including multiple backside vias 24a, 24b according to another embodiment of the present invention. LED 70 includes gallium nitride material device region 14 formed on transition layer 15. Transition layer 15 may be compositionally-graded and is formed on silicon substrate 12. In the illustrative embodiment, the following layers comprise gallium nitride material device region 14 in succession: a silicon-doped GaN layer 72, a silicon-doped $Al_xGa_{(1-x)}N$ layer 74 (e.g., containing 0-20% by weight Al), a GaN/InGaN single or multiple quantum well 76, a magnesium-doped $Al_xGa_{(1-x)}N$ layer 78 (e.g., containing 10-20% by weight Al), and a magnesium-doped GaN layer 80. Via 24a extends from backside 22 to a position within GaN layer 72 and via 24b extends from backside 22 to a position within GaN layer 80. An n-type backside contact 20a is formed within via 24a and a p-type backside contact 20b is formed within via 24b. A dielectric layer 31 isolates portions of p-type backside contact 20b to prevent shorting. It should be understood that LEDs having a variety of different structures may also be provided.

Figure 9:
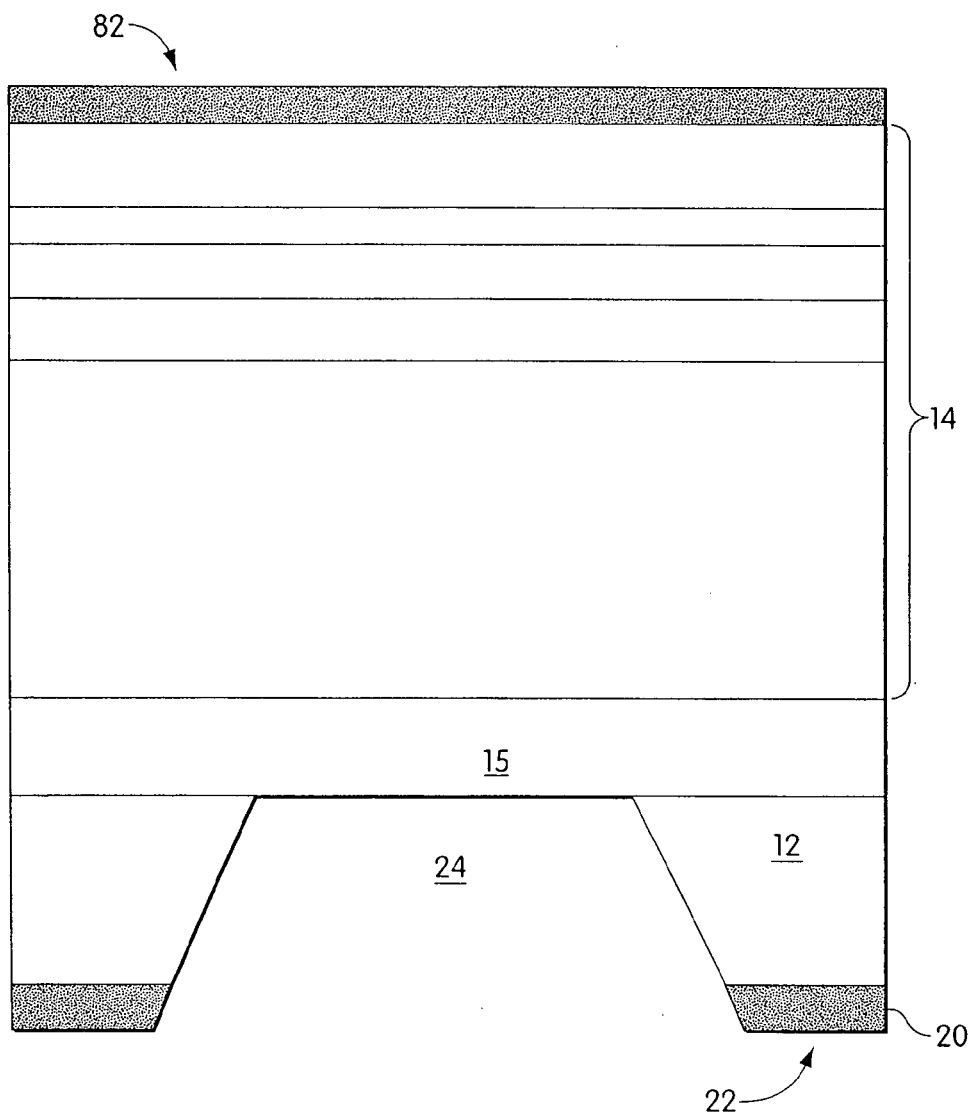
FIG. 9 illustrates a semiconductor device including a backside via free of an electrical contact according to another embodiment of the present invention.

FIG. 9 illustrates a device 82 including backside via 24 that is free of an electrical contact according to another embodiment of the present invention. Device 82 includes gallium nitride material device region 14 formed on a transition layer 15. Device may have any suitable layer arrangement including the layer arrangements (or a portion thereof) of the LED embodiments described herein. Transition layer 15 can be compositionally-graded, as described above. Via 24 extends from backside 22 to transition layer 15, thus, exposing the transition layer to the environment. An n-type contact 20 is formed on backside 22.

Figure 10:
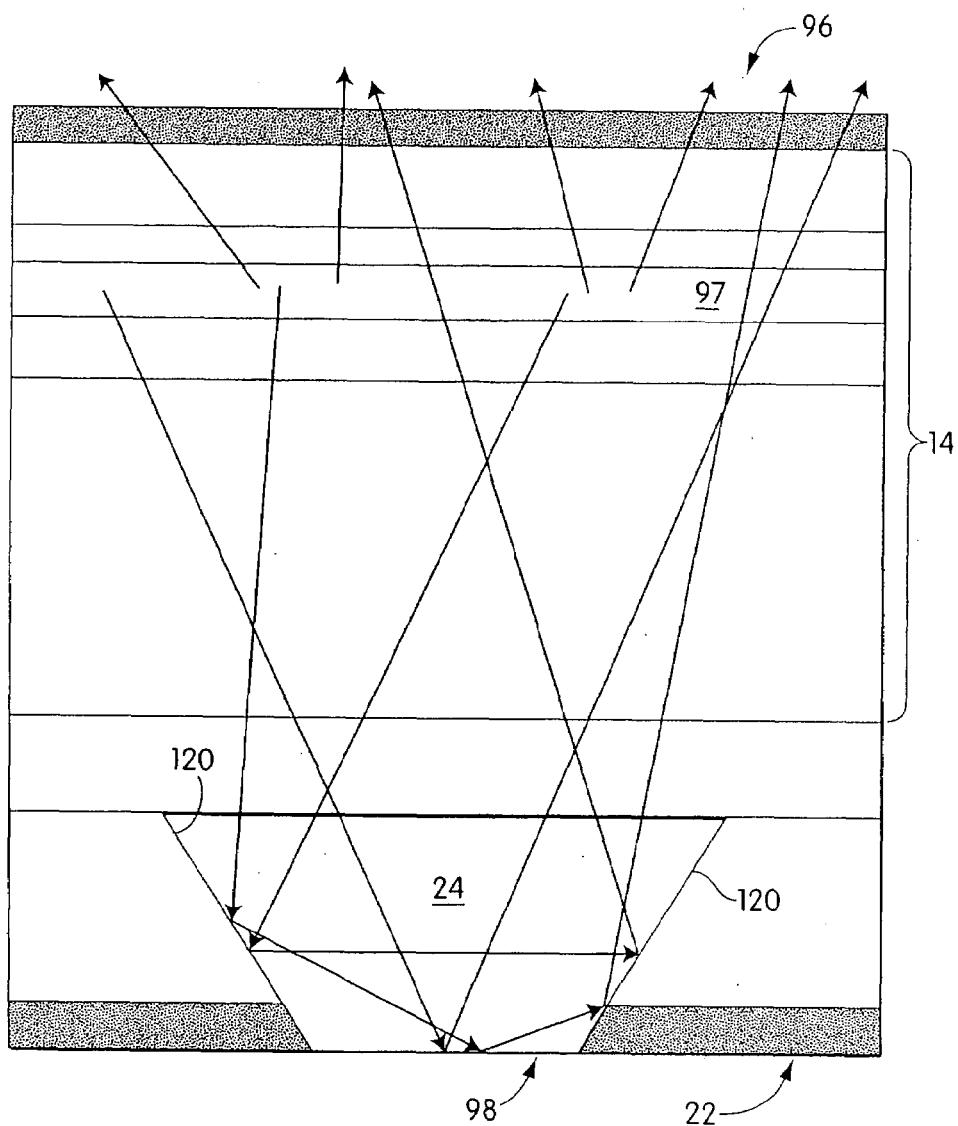
FIG. 10 illustrates a semiconductor device including a backside via having a backside via that is shaped to enhance internal reflection of light according to another embodiment of the present invention.

FIG. 10 illustrates a device 96 including a backside via 24 having a cross-sectional area that increases in a direction away from backside 22. Device 96 may have any suitable layer arrangement including the layer arrangements (or a portion thereof) of the LED embodiments described herein. In the illustrative embodiment, device 96 is a light emitting device that includes an active region 97 in which light is generated, though other devices of the invention may also include a backside via having this shape. This via shape may enhance internal light reflections (as indicated by the arrows) and external light extraction from the topside of the device. In some cases, and as shown, device 96 may be mounted on a reflective surface 98 to further enhance light reflection and/or a reflector region 120 may be formed on walls of the via. Reflective surface 98, for example, may be the surface of a packaging material or a carrier.

Figure 11:
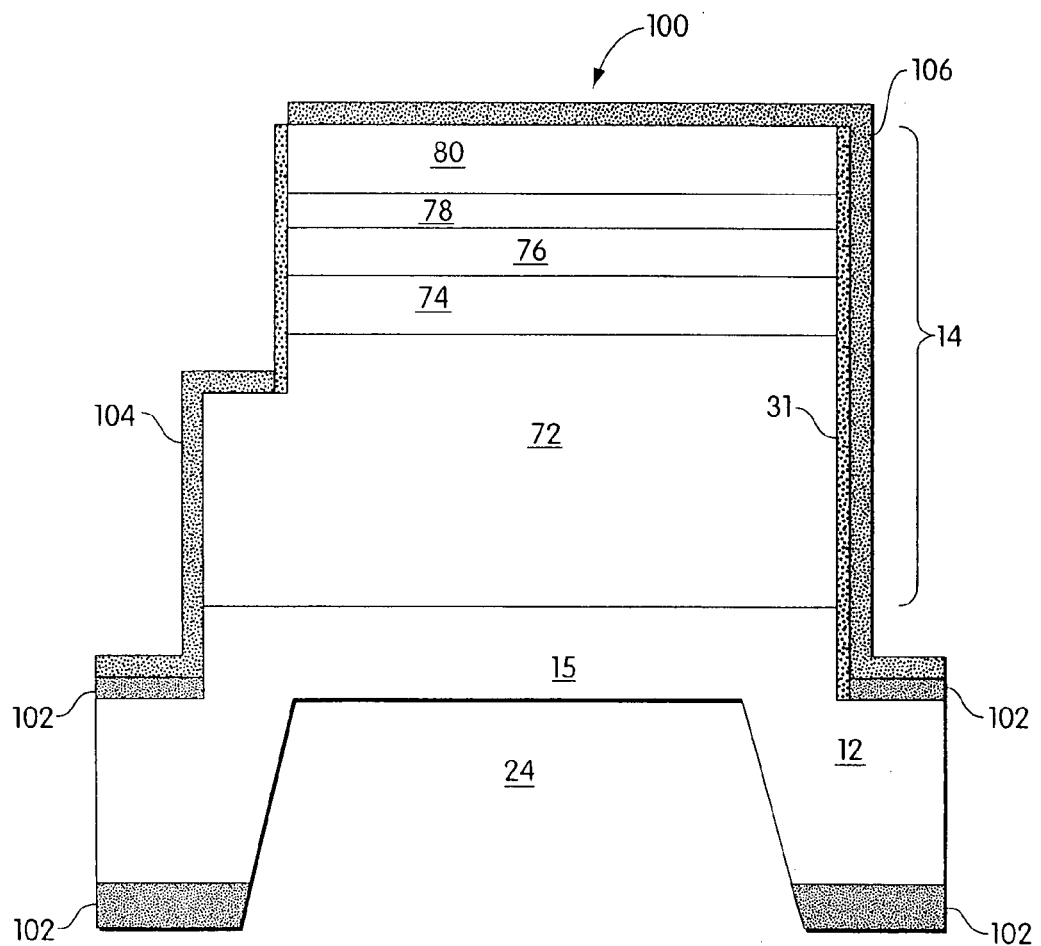
FIG. 11 illustrates a semiconductor device including a positive and negative contact formed on a backside of the device according to another embodiment of the present invention.

FIG. 11 illustrates a device 100 according to another embodiment of the invention. Device 100 includes a number of contacts 102 formed on the front and back of substrate 12. As shown, device 100 includes the same layer arrangement as the LED of FIG. 8, though other suitable layer arrangements are also possible. LED 100 also includes an n-type contact 104 and a p-type contact 106. A dielectric layer 31 isolates portions of the n-type and p-type contacts to prevent shorting.

FIG. 12 illustrates a device 108 according to another embodiment of the present invention. Device 108 has the same layer arrangement as the device of FIG. 11 except that, during processing, the entire substrate has been removed using an etching step. Other layer arrangements may be used. The entire backside of transition layer 15, which may be compositionally-graded or have a constant composition, is exposed to the environment. This embodiment may be particular useful in order to maximize light extraction from the device. It should be understood that other devices of the present invention, including non-light emitting devices, may also be processed by removing the entire substrate. It should also be understood that devices which include an exposed transition layer (e.g., a compositionally-graded transition layer) may also be used in devices that include two topside contacts, for example, as shown in FIG. 13. A topside or a backside of device 108 may be mounted on, or bonded to, a carrier (not shown). The carrier, which may be a wafer (e.g., silicon or GaAs), can provide support and rigidity for the device that may be desirable in the absence of the original substrate.

Figure 14:
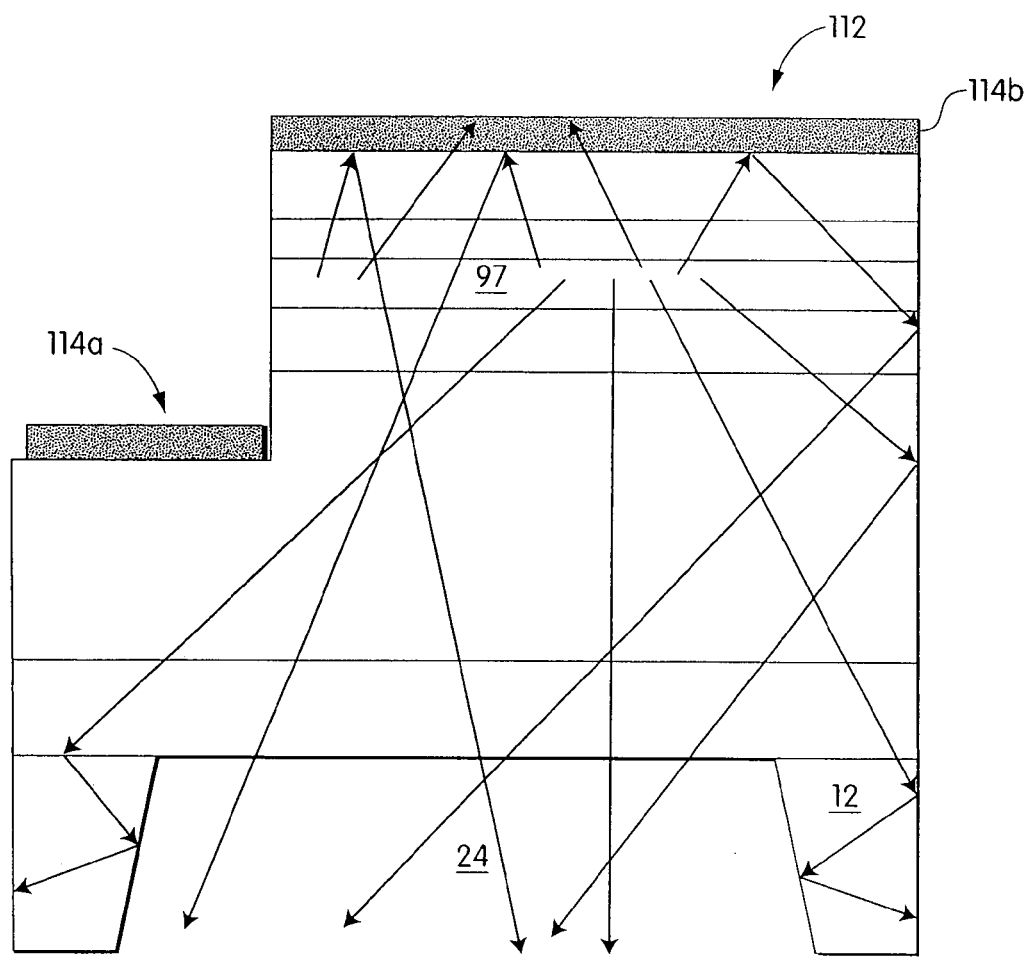
FIG. 14 illustrates a light emitting device including two topside contacts according to another embodiment of the present invention.

FIG. 14 illustrates a light emitting device 112 according to another embodiment of the invention. Device 112 includes an active region 97 and may have any suitable layer arrangement including the layer arrangements (or a portion thereof) of the LED embodiments described herein. Device 112 has two topside contacts 114a, 114b and no backside contacts. Arrows indicate the direction of light. The topside contacts also function as reflector regions which reflect, at least a portion of the light generated in layer 97. In this embodiment, light is emitted out of the backside of the device.

Figure 24:
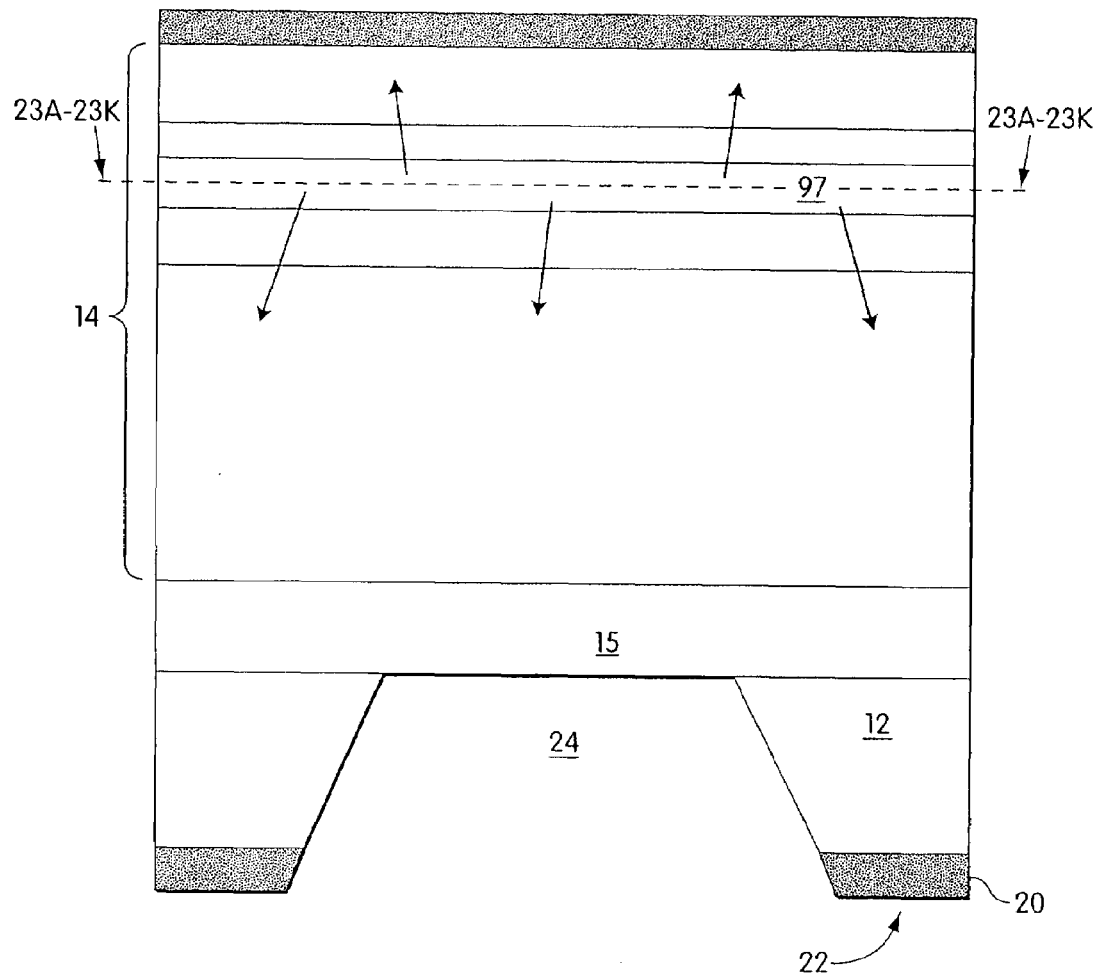
FIG. 24 illustrates an opto-electronic device including an active region according to another embodiment of the invention.

FIG. 15 illustrates a light emitting device 116 according to another embodiment of the invention. During processing of device, the substrate has been removed, for example, by an etching step. A topside or a backside of device 116 may be mounted on, or bonded to, a carrier (not shown, See FIG. 24) which provides support and rigidity for the device. In this illustrative embodiment, the entire backside of a transition layer 15b having a constant composition (e.g., an intermediate layer of a gallium nitride alloy, aluminum nitride, or an aluminum nitride alloy) is exposed. A compositionally-graded transition layer 15a is formed on constant composition transition layer 15b. It should also be understood that, in some embodiments, constant composition transition layer 15b is absent (or otherwise positioned) and compositionally-graded transition layer 15a is exposed. In some cases, a passivating layer may be formed on transition layer 15b; or, transition layer 15b may be mounted on the surface of a packaging material. The illustrative embodiment may be particular useful in order to maximize light extraction from the device. Device 116 also has two topside contacts 114a, 114b and no backside contacts. The absence of backside contacts also enhances light emission. It should be understood that light emitting device 116 may have any suitable layer arrangement including the layer arrangements (or a portion thereof) of the LED embodiments described herein.

FIG. 16 illustrates a light emitting device 118 according to another embodiment of the invention that includes reflector region 120 located below the active region 97. Reflector region 120 reflects a substantial portion of the light (indicated by arrows) emitted from the active region in the direction of the topside of the device. Therefore, this structure enhances light emission out of the topside of the device. It should be understood that light emitting device 116 may have any suitable layer arrangement including the layer arrangements (or a portion thereof) of the LED embodiments described herein.

Figure 17:
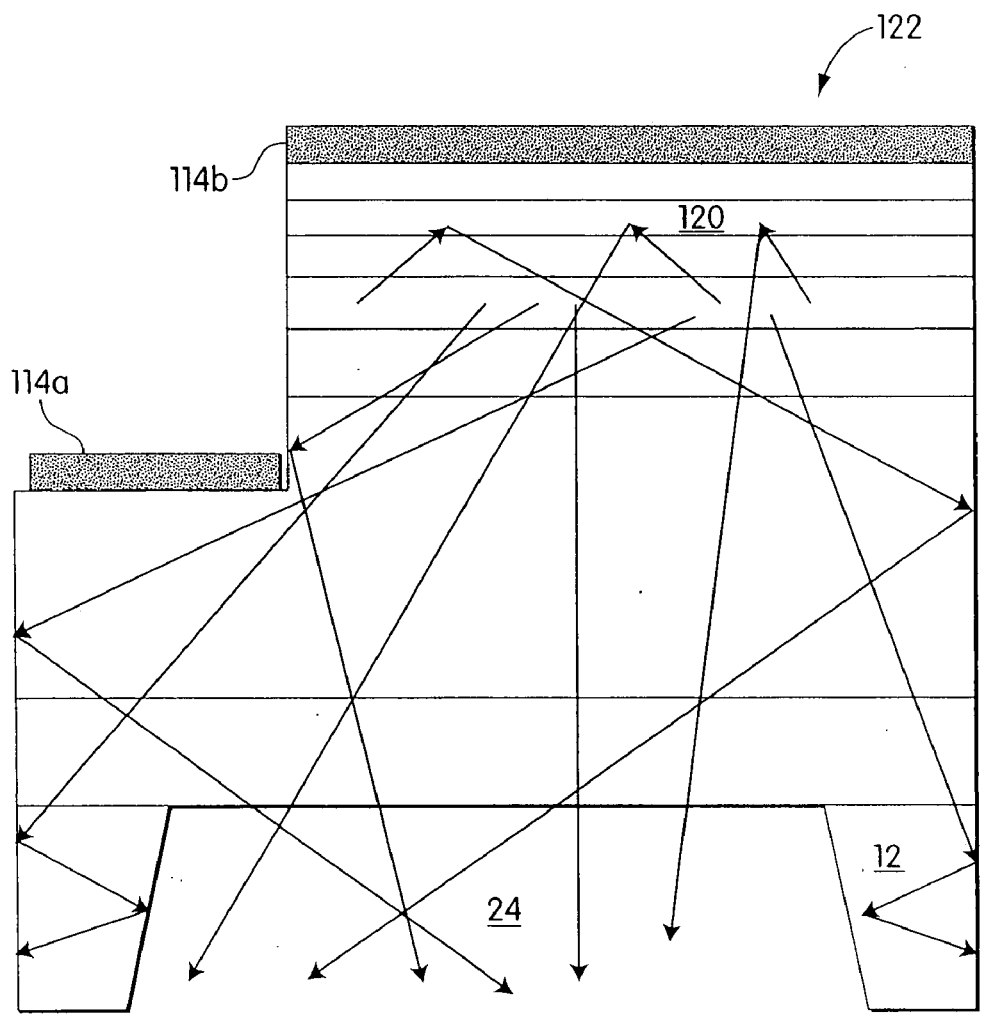
FIG. 17 illustrates a light emitting device including a reflector region according to another embodiment of the present invention.

FIG. 17 illustrates a light emitting device 122 according to another embodiment of the invention that includes reflector region 120 located above the active region 97. Reflector region 120 reflects a substantial portion of the light (indicated by arrows) emitted from the light emitting region in the direction of the backside of the device. Therefore, this structure enhances light emission out of the backside of the device. It should be understood that light emitting device 122 may have any suitable layer arrangement including the layer arrangements (or a portion thereof) of the LED embodiments described herein.

Figure 19:
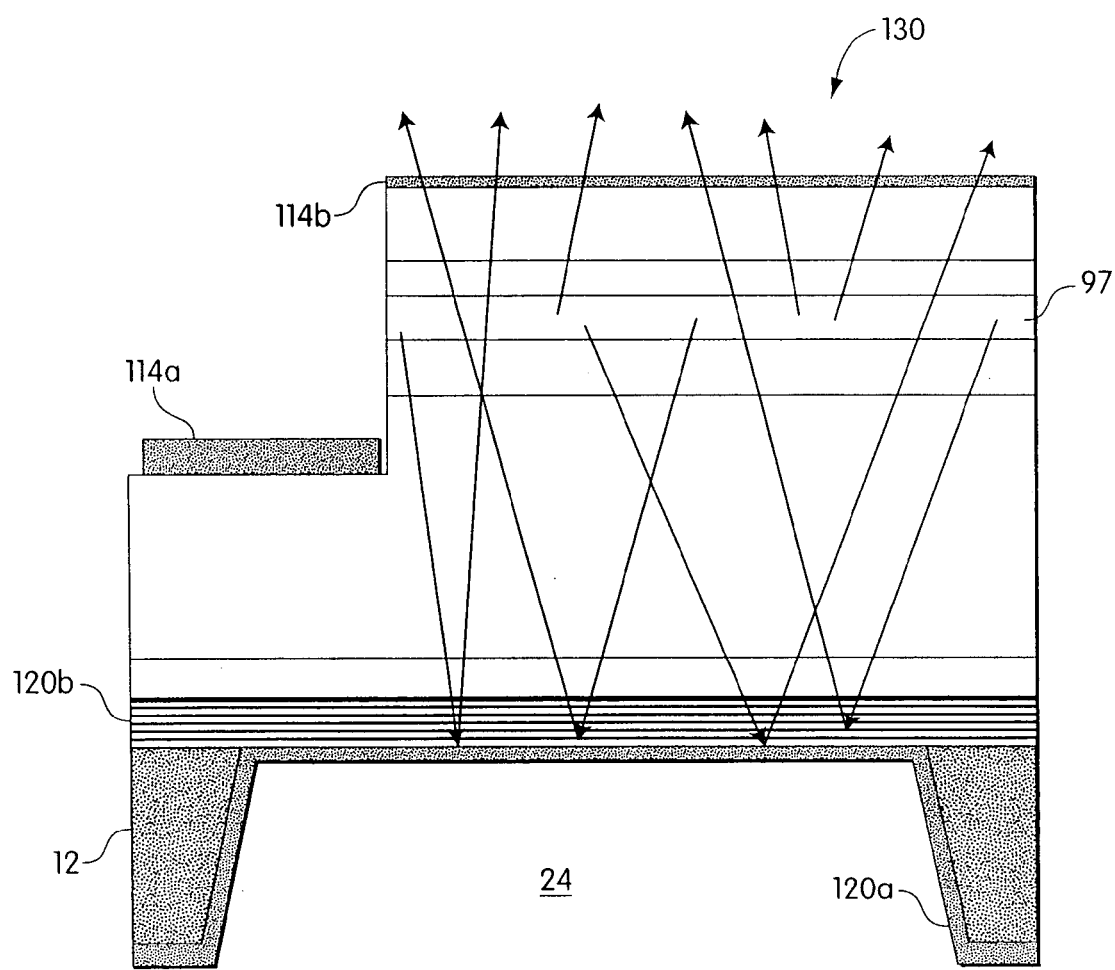
FIG. 19 illustrates a light emitting device including a reflector region formed within a via according to another embodiment of the present invention.

FIG. 19 illustrates a light emitting device 130 according to another embodiment of the invention that includes a first reflector region 120a formed within via 24. Device 130 has two topside contacts 114a, 114b. Reflector region 120a may be, for example, a reflective metal layer. It should be understood that reflector region 120a is not an electrical contact even when it comprises a conductive metal because it is not designed to be contacted by a power source. In the illustrative embodiment, device 130 may include a second reflector region 120b formed over the via which may be a Distributed Bragg Reflector (DBR) that includes a number of semiconductor or dielectric layers. Device 130 includes two reflector regions to increase the ability of the device to reflect generated light in the desired direction. It should be understood, however, that other devices may include only one reflector region which may be formed within the via or may be formed over the via. It should be understood that light emitting device 130 may have any suitable layer arrangement including the layer arrangements (or a portion thereof) of the LED embodiments described herein.

Figure 20:
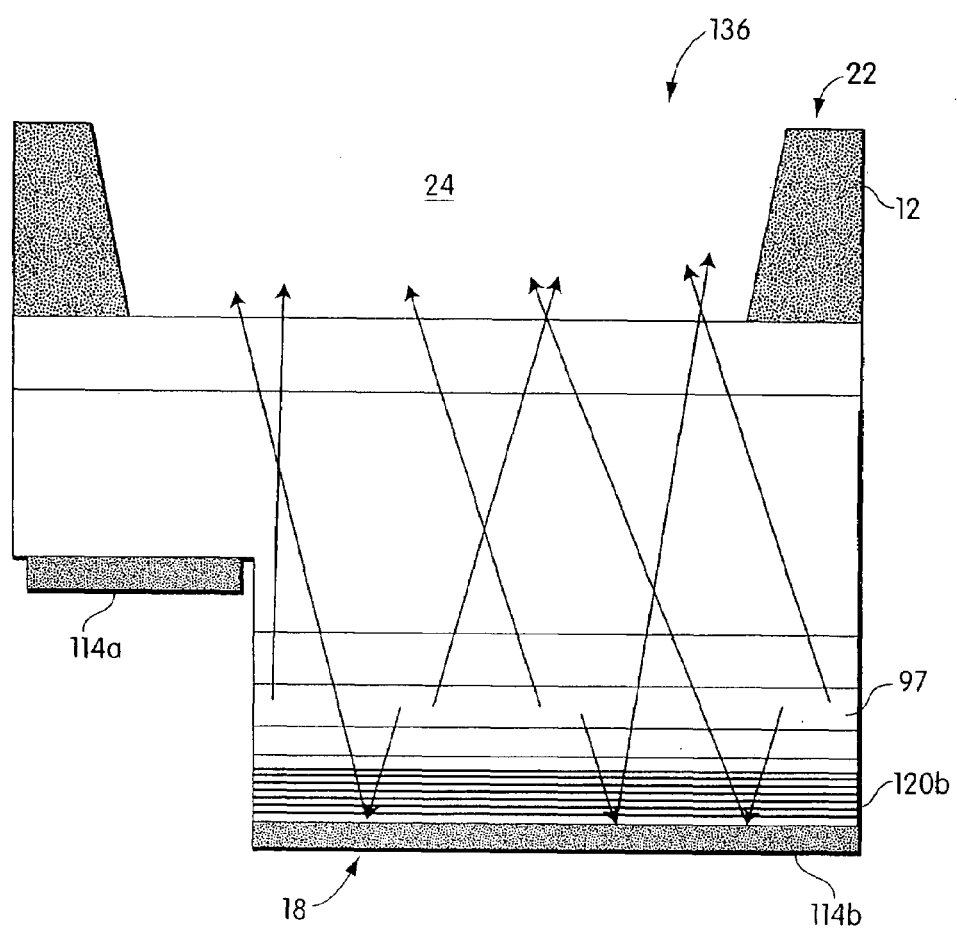
FIG. 20 illustrates a light emitting device that has been flipped during use according to another embodiment of the present invention.

FIG. 20 illustrates a light emitting device 136 that has been flipped during use so that backside 22 faces upward and topside 18 faces downward. Topside contact 114b also functions as a reflector region that can upwardly reflect light generated in region 97. The device also includes a second reflector region 120b which may be a Distributed Bragg Reflector (DBR) that includes a number of semiconductor or dielectric layers. Device 136 includes two reflector regions to increase the ability of the device to reflect generated light in the desired direction. It should be understood, however, that other devices may include only one reflector region which may be an electrical contact (e.g., topside contact 114*b*) or a layer(s) within the structure of the device. It should be understood that light emitting device 136 may have any suitable layer arrangement including the layer arrangements (or a portion thereof) of the LED embodiments described herein.

Figure 21:
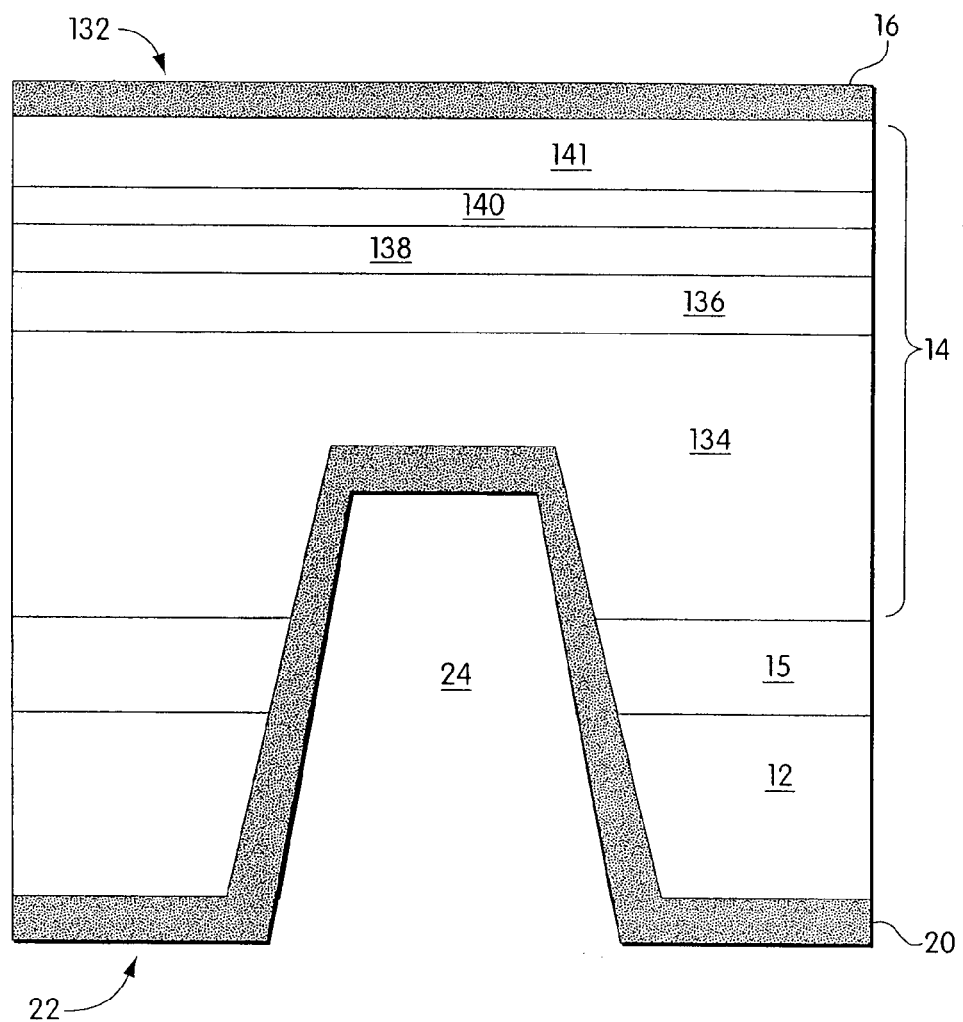
FIG. 21 illustrates an LED designed to emit UV light according to another embodiment of the present invention.

FIG. 21 illustrates an LED 132 designed to emit ultraviolet light, for example, having a wavelength between about 200 nm and about 410 nm. LED 132 includes gallium nitride material device region 14 formed on transition layer 15. Transition layer 15 may be compositionally-graded and is formed on silicon substrate 12. In the illustrative embodiment, the following layers comprise gallium nitride material device region 14 in succession: a silicon-doped $Al_xGa_{(1-x)}N$ layer 134 (e.g., containing 0-100% Al), a silicon-doped $Al_xGa_{(1-x)}N$ layer 136 (e.g., containing 20-80% by weight Al), an active region 138, a magnesium-doped $Al_xGa_{(1-x)}N$ layer 140 (e.g., containing 20-80% by weight Al), and a magnesium-doped $Al_xGa_{(1-x)}N$ layer 141 (e.g., containing 0-80% by weight Al). Active region 138 may be a single or multiple quantum well (e.g., $Al_xGa_{(1-x)}N/GaN$, $Al_xGa_{(1-x)}N/Al_yGa_{(1-y)}N$, $Al_xGa_{(1-x)}N/Al_yIn_{(1-y)}N$, or $Al_xIn_yGa_{(1-x-y)}N/Al_aIn_bGa_{(1-a-b)}N$). In some cases, layers 134, 136, 140, 141 may be superlattices and may include delta-doped regions to enhance conductivity. Topside contact 16 is formed of a metal on a p-type region and backside contact 20 is formed of a metal on an n-type region. It should be understood that LEDs having a variety of different structures may also be provided according to the invention including other types of LEDs that emit UV light and LEDs that emit visible light.

FIGS. 23A-23K show a series of plane-view cross-sections of the active regions 97 of a series of opto-electronic devices according to additional embodiments of the present invention. A plane-view cross-section is the cross-section of the active region taken in the plane of the active region (See FIG. 24). Though FIGS. 23A-23K are taken with respect to the active region 97 shown in FIG. 24, it should be understood that active regions having the illustrated plane-view cross-sections also may be formed in any other suitable device structure including the other device structures described herein.

Figure 23A:
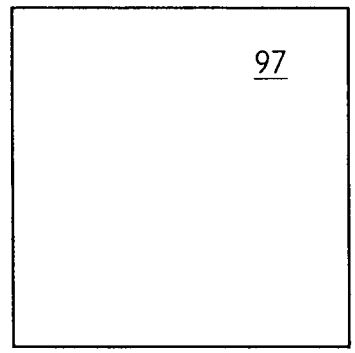
FIGS. 23A-23K illustrate a series of plane-view cross-sections of respective active regions of opto-electronic devices according to additional embodiments of the invention.
Figure 23B:
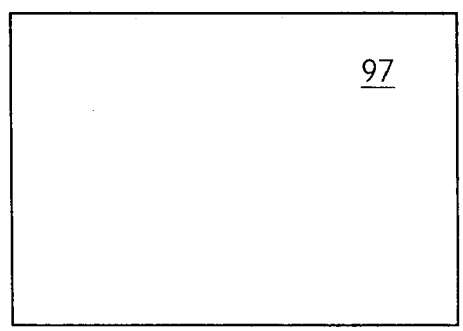
Figure 23C:
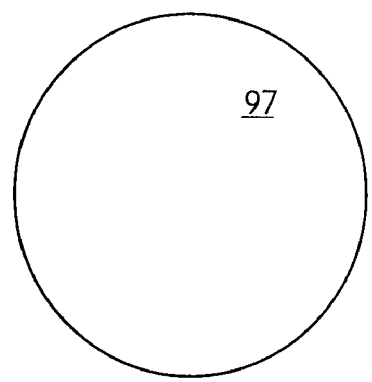
Figure 23D:
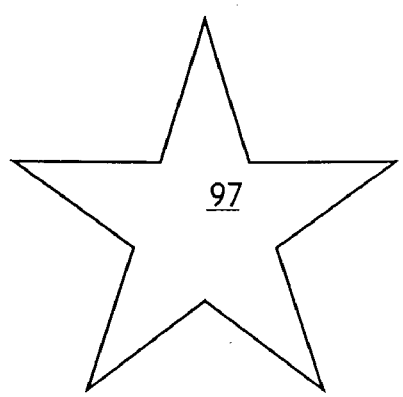
Figure 23E:
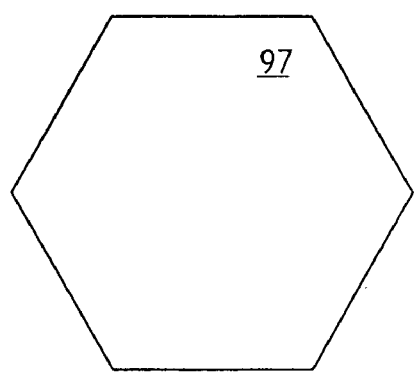
Figure 23F:
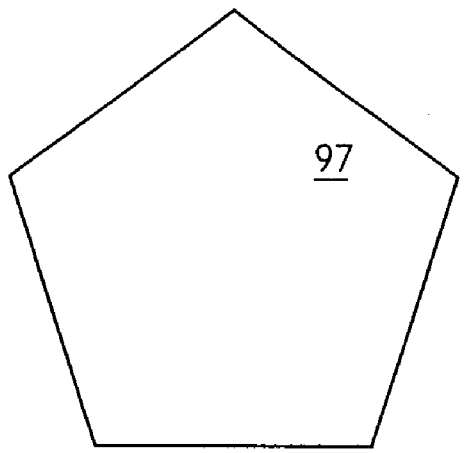
Figure 23G:
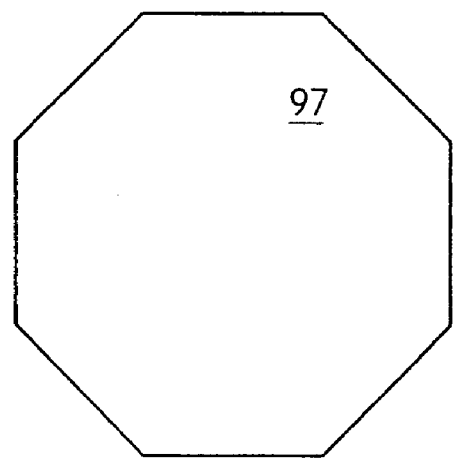
Figure 23H:
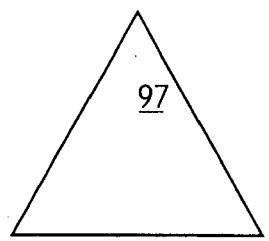
Figure 23I:
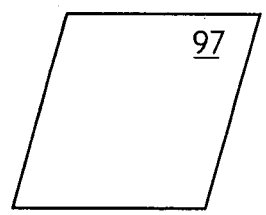
Figure 23J:
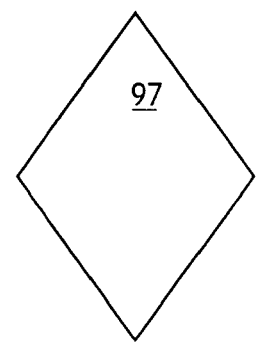
Figure 23K:
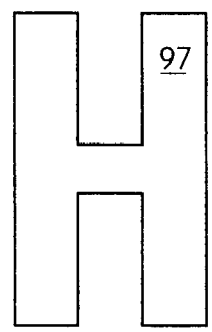

As seen in the figures, the devices of the invention may include active regions having a variety of plane-view cross-sections that may be designed for specific applications. In some cases, the plane-view cross-sections are rectangular or square (FIGS. 23A and 23B). Advantageously, certain embodiments of the invention, also enables formation of non-rectangular plane-view cross-sections including circular (FIG. 23C), star-shaped (FIG. 23D), hexagon (FIG. 23E), pentagon (FIG. 23F), octagon (FIG. 23G), triangular (FIG. 23H), trapezoid (FIG. 23I), diamond (FIG. 23J) and H-shaped (FIG. 23K), amongst others.

Active regions having non-rectangular plane-view cross-sections may improve light extraction over conventional square or rectangular cross-sections by reducing internal reflective losses. Advantageously, the shape of the cross-sections may be tailored for the specific device to optimize light extraction efficiency. In some embodiments, it may be preferred to enhance light extraction for the active region to have a non-rectangular, non-circular plane view cross-section. A variety of other active region cross-sections may also be utilized in accordance with the present invention.

Active regions having non-rectangular plane-view cross-sections may be formed using an etching process. In some cases, the etching process used to form the active regions may be the same etching process used to separate individual devices processed on the same wafer from one another, as described above. This etching process may be used to form the active region and separate devices, for example, when the substrate is silicon because silicon may be readily etched, in contrast to other types of substrates (e.g., sapphire and silicon carbide) which typically require the use of a dicing operation to separate devices. In cases when the etching process used to form the active region is the same as the etching process used to separate individual devices processed on the same wafer, the active region may have the same plane-view cross-section as other non-active regions on the device (including other layers and the substrate), as well as the overall die shape. It should be understood that though the same etching process is used to form the active region and to separate individual devices processed on the same wafer, different etching chemistries may be used at various stages during this process, for example, to etch through different layers.

It should be understood that active regions having non-rectangular plane-view cross-sections may be formed in an etching process that does not separate individual devices processed on the same wafer from one another. In these cases, the individual devices may be separated using conventional dicing steps, for example, to form devices having a rectangular die shape. In these cases, the active region may have a non-rectangular plane-view cross-section, while non-active regions may have a different plane-view cross-section (including a rectangular plane-view cross-section).

FIG. 25 shows a light emitting device 160 according to another embodiment of the present invention. During processing of device 160, the substrate has been removed, for example, by an etching step. In this illustrative embodiment, device 160 includes a topside contact 16 and a backside contact 20. Topside contact 16 also functions as a reflector region. Backside contact 20 is formed on a transition layer 15*b* having a constant composition. A compositionally-graded transition layer 15*a* is formed on constant composition transition layer 15*b*. Transition layers 15*a*, 15*b* are sufficiently conductive to enable conduction between topside contact 16 and backside contact 20. In some cases, transition layers 15*a*, 15*b* may be doped to achieve sufficient conductivity. It should also be understood that, in some embodiments, other transition layer arrangements are possible including those described above. In the illustrative embodiment, a topside of the device is mounted to a carrier 162. Carrier 162, for example, may be a wafer (e.g., silicon or GaAs). Carrier 162 provides support and rigidity for the device. It should be understood that in other embodiments carrier 162 may be mounted on a bottom side of the device. In other cases, a contact may be formed on the carrier.

It should be understood that light emitting device 160 may have any suitable layer arrangement including the layer arrangements (or a portion thereof) of the LED embodiments described herein.

Those skilled in the art would readily appreciate that all parameters listed herein are meant to be exemplary and that the actual parameters would depend upon the specific application for which the semiconductor materials and methods of the invention are used. It is, therefore, to be understood that the foregoing embodiments are presented by way of example only and that, within the scope of the appended claims and equivalents thereto the invention may be practiced otherwise than as specifically described.

What is claimed is:

1. A semiconductor device comprising:
   a substrate;
   a gallium nitride material region formed over the substrate;
   a first electrical contact formed over a portion of the gallium nitride material region;
   a second electrical contact formed over a portion of the gallium nitride material region; and
   at least one via extending from a first side of the semiconductor device and having electrically conductive material formed therein, the electrically conductive material being in direct contact with the first electrical contact.

2. The semiconductor device of claim 1, wherein the first electrical contact is formed over a first portion of the gallium nitride material region and the second electrical contact is formed over a second portion of the gallium nitride material region, wherein the first portion and the second portion are on different planes.

3. The semiconductor device of claim 1, wherein the first electrical contact is formed over a first portion of the gallium nitride material region and the second electrical contact is formed over a second portion of the gallium nitride material region, wherein the first portion and the second portion are on the same plane.

4. The semiconductor device of claim 1, further comprising a transition layer formed between the substrate and the gallium nitride material region.

5. The semiconductor device of claim 4, wherein the transition layer is compositionally-graded and further comprising a constant composition transition layer formed between the substrate and the compositionally-graded transition layer, the constant composition transition layer comprising a gallium nitride alloy, aluminum nitride, or an aluminum nitride alloy.

6. The semiconductor device of claim 1, wherein the semiconductor device is a light emitting device.

7. The semiconductor device of claim 6, wherein the semiconductor device is an LED.

8. The semiconductor device of claim 1, wherein the semiconductor device is a light-detecting device.

9. The semiconductor device of claim 1, further comprising a third electrical contact.

10. The semiconductor device of claim 9, wherein the first electrical contact is a source electrode, the second electrical contact is a drain electrode, and the third electrical contact is a gate electrode.

11. The semiconductor device of claim 1, wherein the at least one via extends from a backside of the semiconductor device.

12. The semiconductor device of claim 1, wherein the electrically conductive material comprises a first material and the device further comprises a layer of a second material, different than the first material, formed between a portion of the first material and a sidewall of the via.

13. The semiconductor device of claim 12, wherein the first material is gold.

14. The semiconductor device of claim 1, wherein the electrically conductive material comprises titanium and gold.

15. The semiconductor device of claim 1, wherein the device is a transistor.

16. The semiconductor device of claim 1, further comprising at least one non-conducting layer formed between the substrate and the gallium nitride material region.

17. The semiconductor device of claim 1, wherein the gallium nitride material region includes a GaN layer and an AlGaN layer formed on the GaN layer.

18. The semiconductor device of claim 1, wherein the via extends to a source region of the device.

19. The semiconductor device of claim 1, wherein the via extends to the gallium nitride material region.

20. The semiconductor device of claim 1, wherein the substrate is a silicon substrate.

21. The semiconductor device of claim 20, further comprising a transition layer comprising a gallium nitride alloy between the silicon substrate and the gallium nitride material layer, wherein a gallium concentration in the transition layer is increased from a back surface of the transition layer to a top surface of the transition layer.

22. The semiconductor device of claim 20, wherein the gallium nitride material region has a thickness of greater than 0.5 micron and a crack level of less than 0.005 micron/micron$^2$.

23. The semiconductor device of claim 22, wherein the gallium nitride material region has a thickness of greater than 1.0 micron.

24. The semiconductor device of claim 1, wherein the substrate is a sapphire substrate.

25. The semiconductor device of claim 1, wherein the substrate is a silicon carbide substrate.

26. The semiconductor device of claim 1, wherein the via extends from a backside of the semiconductor device to a topside of the semiconductor device.

27. The semiconductor device of claim 1, wherein the electrically conductive material extends from a backside of the semiconductor device to a topside of the semiconductor device.

28. The semiconductor device of claim 1, wherein the electrically conductive material is formed, in part, on a backside of the semiconductor device.

29. The semiconductor device of claim 1, wherein the first electrical contact is formed, in part, from the electrically conductive material formed in the via.

30. The semiconductor device of claim 29, wherein the first electrical contact extends to a backside of the semiconductor device.

31. The semiconductor device of claim 30, wherein the first electrical contact extends from a topside of the semiconductor device to the backside of the semiconductor device.

32. The semiconductor device of claim 30, wherein the first electrical contact is formed, in part, on the backside of the semiconductor device.

33. The semiconductor device of claim 29, wherein the first electrical contact is contacted by a power source at the backside of the semiconductor device.

34. The semiconductor device of claim 29, further comprising a third electrical contact.

35. The semiconductor device of claim 34, wherein the first electrical contact is a source electrode, the second electrical contact is a drain electrode, and the third electrical contact is a gate electrode.

36. The semiconductor device of claim 29, wherein the via extends from a topside of the semiconductor device.

37. The semiconductor device of claim 29, wherein the substrate is a silicon substrate.

38. The semiconductor device of claim 37, further comprising a transition layer comprising a gallium nitride alloy between the silicon substrate and the gallium nitride material layer, wherein a gallium concentration in the transition layer is increased from a back surface of the transition layer to a front surface of the transition layer.

39. The semiconductor device of claim 37, wherein the gallium nitride material region has a thickness of greater than 0.5 micron and a crack level of less than 0.005 micron/micron$^2$.

40. The semiconductor device of claim 39, wherein the gallium nitride material region has a thickness of greater than 1.0 micron.

41. The semiconductor device of claim 29, wherein the device is a transistor.

42. The semiconductor device of claim 29, further comprising at least one non-conducting layer formed between the substrate and the gallium nitride material region.

43. The semiconductor device of claim 42, wherein the electrically conductive material extends through the non-conducting layer.

44. The semiconductor device of claim 29, wherein the gallium nitride material region includes a GaN layer and an AlGaN layer formed on the GaN layer.

45. The semiconductor device of claim 29, wherein the electrically conductive material is formed on sidewalls of the via.

46. The semiconductor device of claim 1, wherein the electrically conductive material is formed on sidewalls of the via.

47. The semiconductor device of claim 1, wherein the via extends from a backside of the semiconductor device to a position within the gallium nitride material region such that the electrically conductive material is separated from the first electrical contact at least in part by a portion of the gallium nitride material region.

* * * * *